(12) United States Patent
Wang et al.

(10) Patent No.: US 12,666,991 B2
(45) Date of Patent: Jun. 23, 2026

(54) INTEGRATED DEVICE COMPRISING PILLAR INTERCONNECTS WITH VARIABLE WIDTHS

(71) Applicant: QUALCOMM Incorporated, San Diego, CA (US)

(72) Inventors: Wei Wang, San Diego, CA (US); Dongming He, San Diego, CA (US); Yangyang Sun, San Diego, CA (US); Wei Hu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 684 days.

(21) Appl. No.: 17/855,189

(22) Filed: Jun. 30, 2022

(65) Prior Publication Data

US 2024/0006361 A1     Jan. 4, 2024

(51) Int. Cl.
*H10W 72/20* (2026.01)
*H10W 72/00* (2026.01)
(Continued)

(52) U.S. Cl.
CPC ......... *H10W 72/20* (2026.01); *H10W 72/012* (2026.01); *H10W 72/01235* (2026.01); *H10W 72/072* (2026.01); *H10W 72/07236* (2026.01); *H10W 72/222* (2026.01); *H10W 72/234* (2026.01); *H10W 72/242* (2026.01);
(Continued)

(58) Field of Classification Search
CPC ......... H01L 24/13; H01L 24/11; H01L 24/04; H01L 24/05; H01L 24/16; H01L 24/81; H01L 2224/0401; H01L 2224/05022;
H01L 2224/05073; H01L 2224/05558;
H01L 2224/05572; H01L 2224/05573;
H01L 2224/1146; H01L 2224/11903;
H01L 2224/13016; H01L 2224/13017;
H01L 2224/13021; H01L 2224/13082;
(Continued)

(56) References Cited

U.S. PATENT DOCUMENTS 10,236,268 B1 * 3/2019 Dhandapani ........ H10W 72/012
2008/0003715 A1   1/2008 Lee et al.
(Continued)

OTHER PUBLICATIONS

International Search Report and Written Opinion—PCT/US2023/068616—ISA/EPO—Oct. 11, 2023.

*Primary Examiner* — Fernando L Toledo
*Assistant Examiner* — Shawn Shaw Muslim
(74) *Attorney, Agent, or Firm* — Loza & Loza, LLP

(57) ABSTRACT

An integrated device comprising a die portion that includes a plurality of pads and a plurality of under bump metallization interconnects coupled to the plurality of pads, where the plurality of under bump metallization interconnects comprises a first under bump metallization interconnect. The integrated device includes a plurality of pillar interconnects coupled to the plurality of under bump metallization interconnects, where the plurality of pillar interconnects includes a first pillar interconnect. The first pillar interconnect includes a first width that corresponds to a widest part of the first pillar interconnect, and a second width that corresponds to a part of the first pillar interconnect that is vertically farthest away from the first under bump metallization interconnect, wherein the second width is less than the first width.

22 Claims, 19 Drawing Sheets

*CROSS SECTIONAL PROFILE VIEW*

(51) Int. Cl.
    *H10W 72/29*         (2026.01)
    *H10W 72/90*         (2026.01)
    *H10W 90/00*         (2026.01)

(52) U.S. Cl.
    CPC ............ *H10W 72/29* (2026.01); *H10W 72/90*
          (2026.01); *H10W 72/923* (2026.01); *H10W*
          *72/934* (2026.01); *H10W 72/9415* (2026.01);
                     *H10W 90/724* (2026.01)

(58) Field of Classification Search
    CPC . H01L 2224/16227; H01L 2224/81815; H01L
                             2224/16058
    See application file for complete search history.

(56)               References Cited

U.S. PATENT DOCUMENTS

2015/0279793 A1   10/2015   Kuo et al.
2019/0096832 A1    3/2019   Tsao et al.

\* cited by examiner

CROSS SECTIONAL PROFILE VIEW

104

203

201

203

104

201

$W_T$ $W_B$ $W_W$

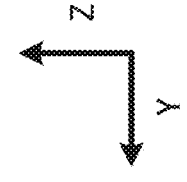
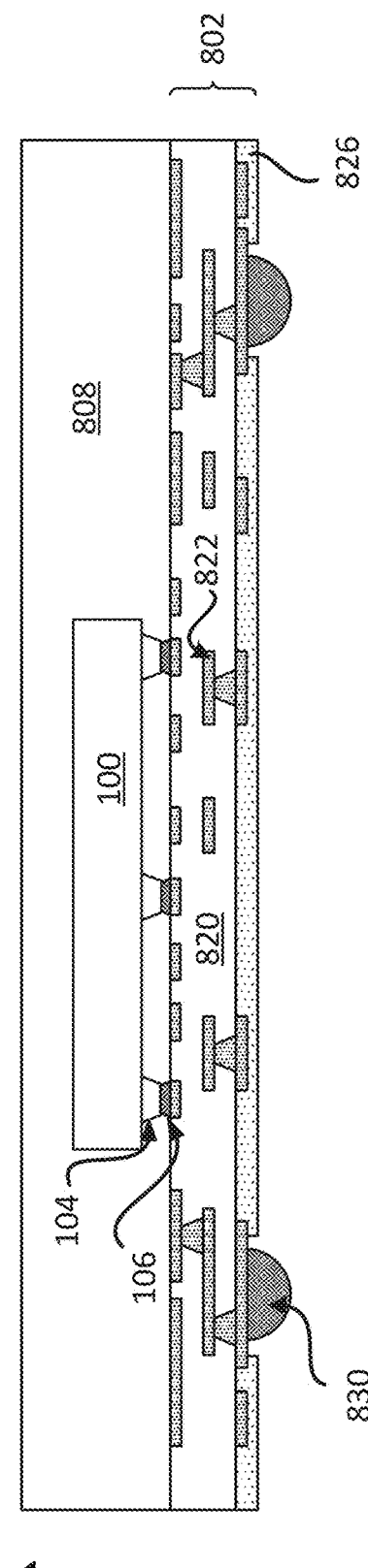
CROSS SECTIONAL PROFILE VIEW
FIG. 8

CROSS SECTIONAL PROFILE VIEW

Figure 10A:
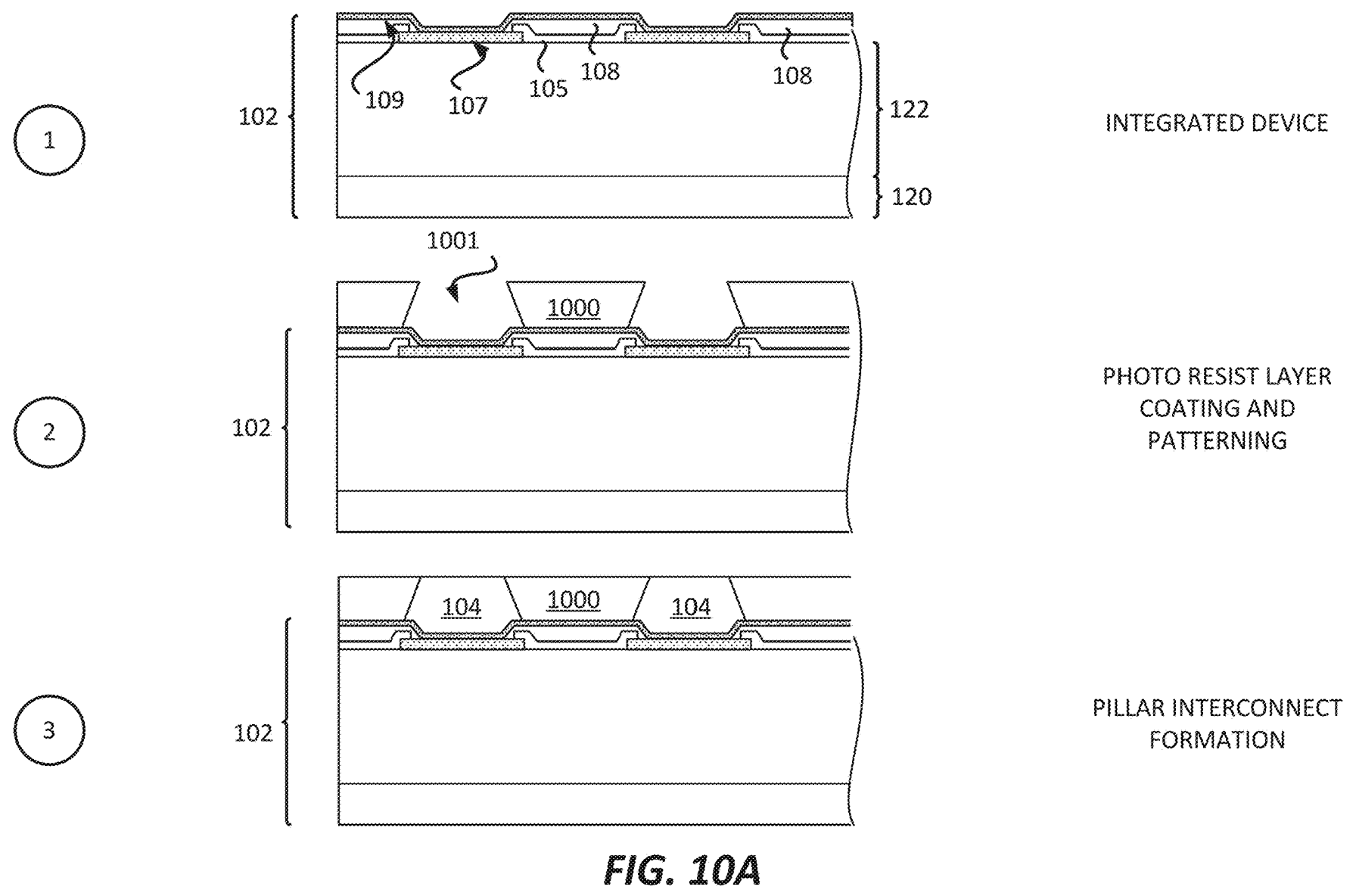

INTEGRATED DEVICE

PHOTO RESIST LAYER
COATING AND
PATTERNING

PILLAR INTERCONNECT
FORMATION

MASK / DRY FILM AND PHOTO RESIST LAYER REMOVAL
PHOTO RESIST LAYER COATING AND PATTERNING
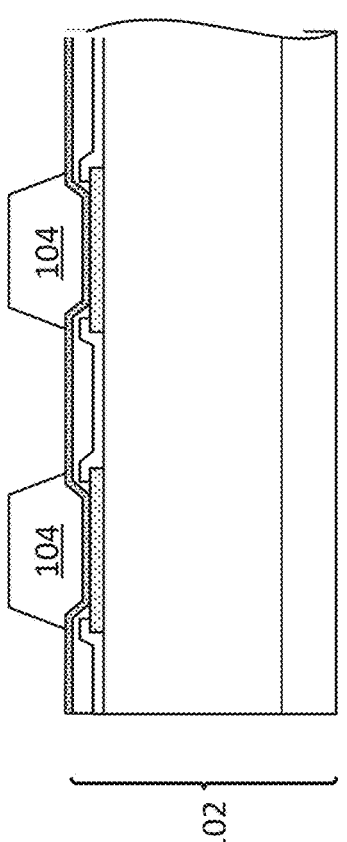
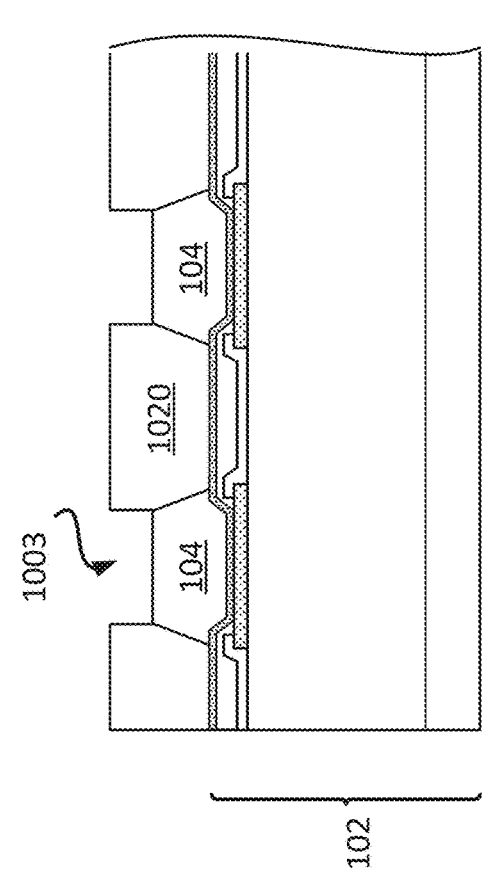
*FIG. 10B*

SOLDER INTERCONNECT FORMATION

PHOTO RESIST LAYER REMOVAL AND UBM REMOVAL

1100

PROVIDE A DIE PORTION COMPRISING PADS AND UNDER BUMP METALLIZATION — 1105

FORM AND PATTERN A FIRST PHOTO RESIST LAYER — 1110

FORM PILLAR INTERCONNECTS — 1115

REMOVE THE FIRST PHOTO RESIST LAYER — 1120

FORM AND PATTERN A SECOND PHOTO RESIST LAYER — 1125

FORM SOLDER INTERCONNECTS — 1130

REMOVE THE SECOND PHOTO RESIST LAYER AND PORTIONS OF THE UNDER BUMP METALLIZATION INTERCONNECTS — 1135

INTEGRATED DEVICE

PHOTO RESIST LAYER COATING AND PATTERNING

PILLAR INTERCONNECT FORMATION

PHOTO RESIST LAYER
COATING AND
PATTERNING
PILLAR INTERCONNECT
FORMATION
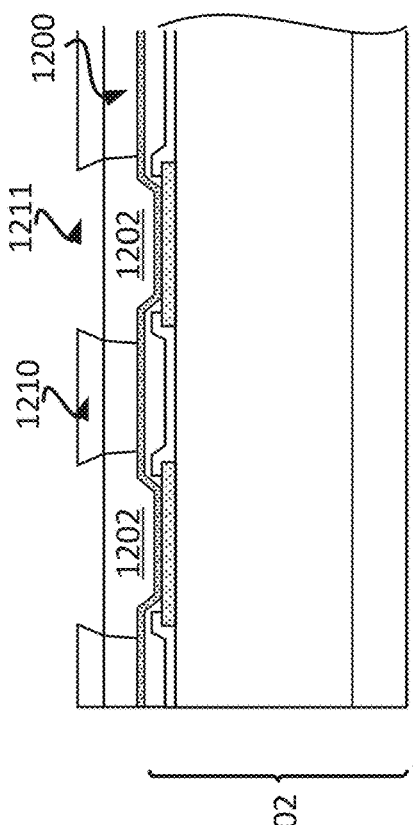
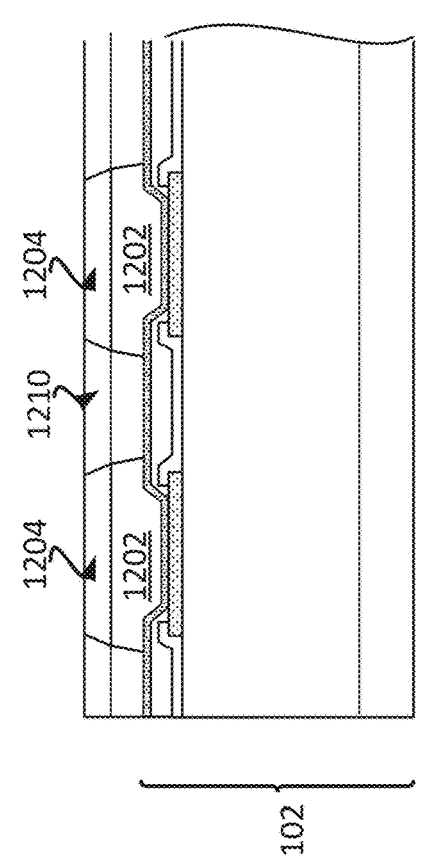
*FIG. 12B*

PHOTO RESIST LAYER
COATING AND
PATTERNING
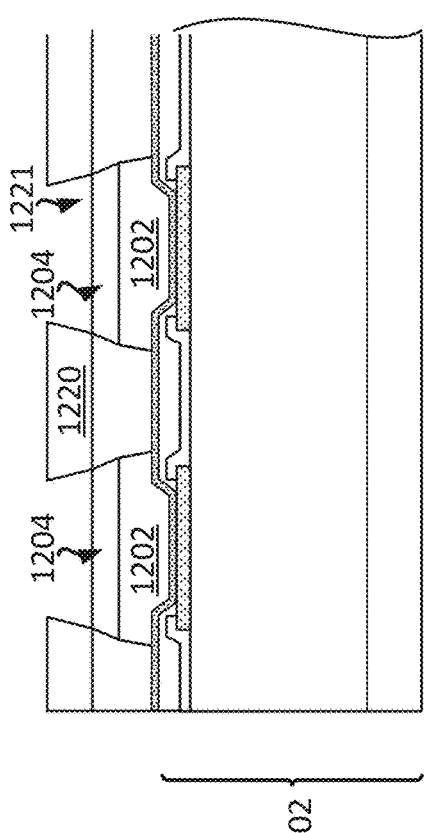
PILLAR INTERCONNECT
FORMATION
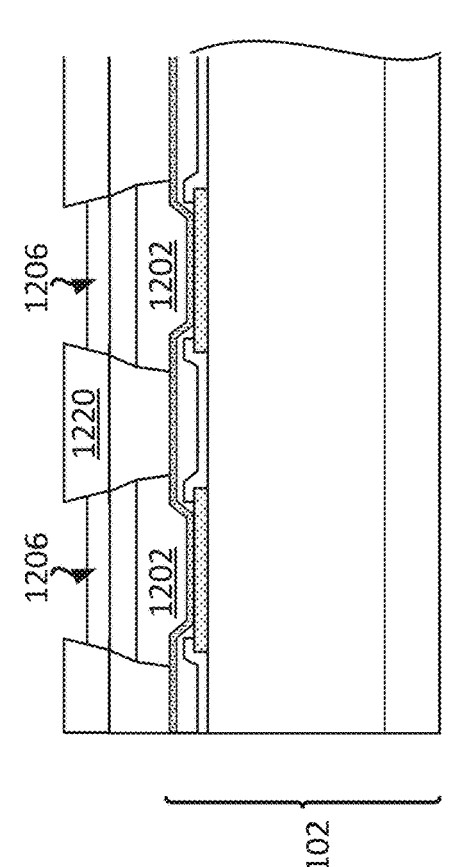
*FIG. 12C*

SOLDER INTERCONNECT FORMATION
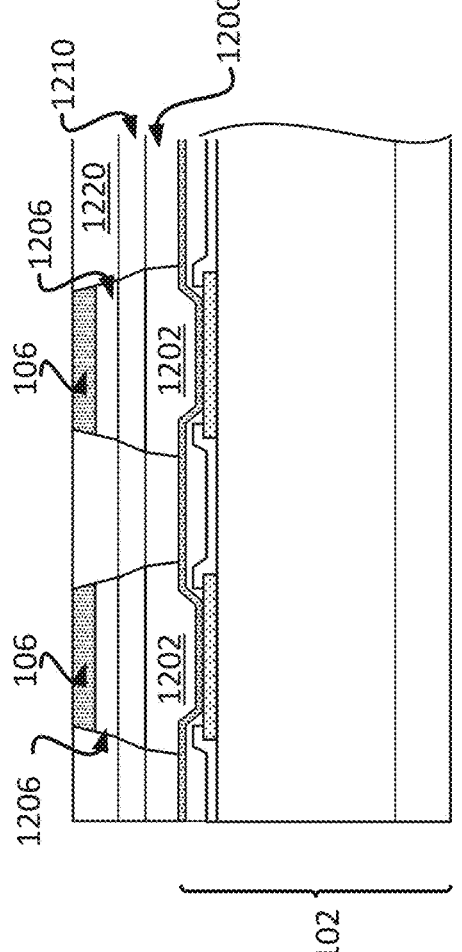
PHOTO RESIST LAYER REMOVAL AND UBM REMOVAL
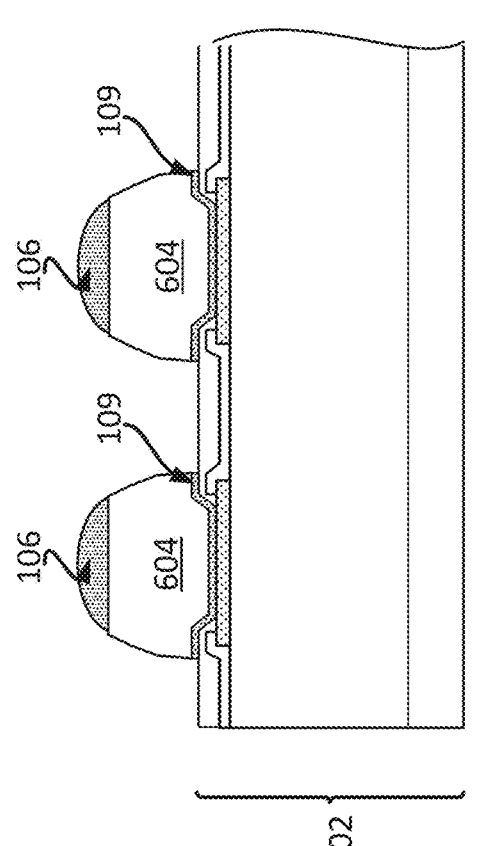
*FIG. 12D*

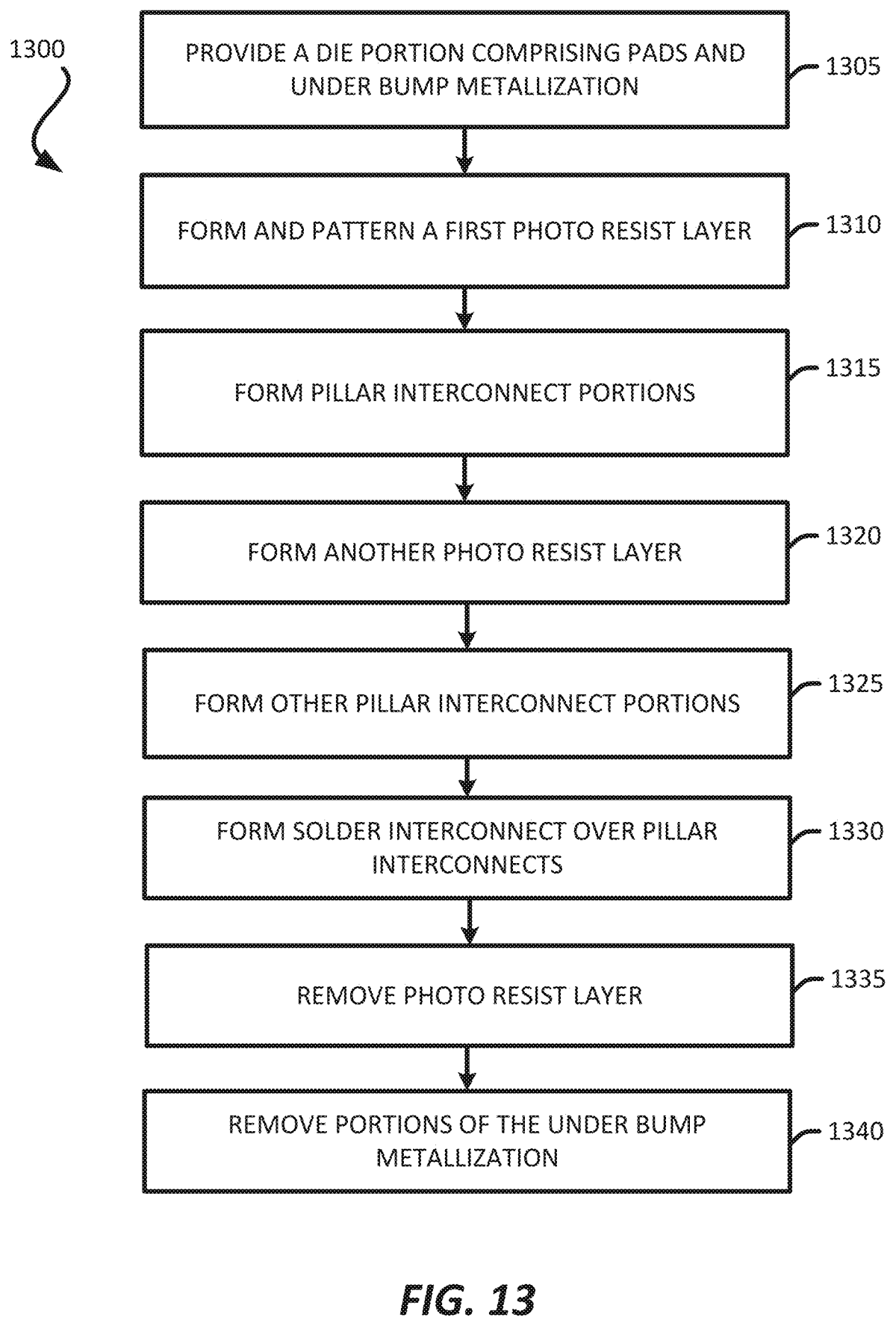

1300

PROVIDE A DIE PORTION COMPRISING PADS AND UNDER BUMP METALLIZATION ⟋ 1305

FORM AND PATTERN A FIRST PHOTO RESIST LAYER ⟋ 1310

FORM PILLAR INTERCONNECT PORTIONS ⟋ 1315

FORM ANOTHER PHOTO RESIST LAYER ⟋ 1320

FORM OTHER PILLAR INTERCONNECT PORTIONS ⟋ 1325

FORM SOLDER INTERCONNECT OVER PILLAR INTERCONNECTS ⟋ 1330

REMOVE PHOTO RESIST LAYER ⟋ 1335

REMOVE PORTIONS OF THE UNDER BUMP METALLIZATION ⟋ 1340

*FIG. 13*

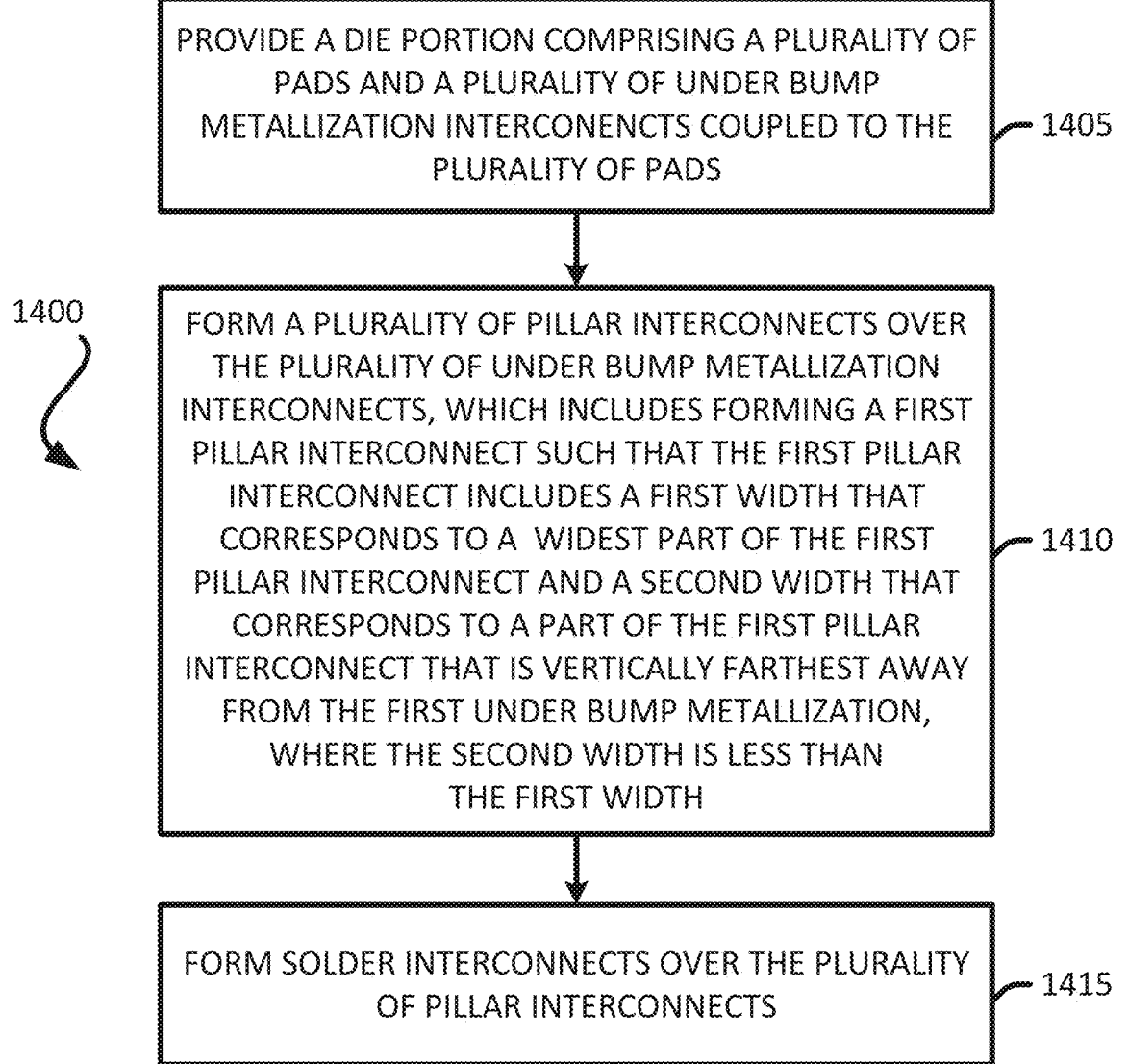

PROVIDE A DIE PORTION COMPRISING A PLURALITY OF PADS AND A PLURALITY OF UNDER BUMP METALLIZATION INTERCONENCTS COUPLED TO THE PLURALITY OF PADS — 1405

FORM A PLURALITY OF PILLAR INTERCONNECTS OVER THE PLURALITY OF UNDER BUMP METALLIZATION INTERCONNECTS, WHICH INCLUDES FORMING A FIRST PILLAR INTERCONNECT SUCH THAT THE FIRST PILLAR INTERCONNECT INCLUDES A FIRST WIDTH THAT CORRESPONDS TO A WIDEST PART OF THE FIRST PILLAR INTERCONNECT AND A SECOND WIDTH THAT CORRESPONDS TO A PART OF THE FIRST PILLAR INTERCONNECT THAT IS VERTICALLY FARTHEST AWAY FROM THE FIRST UNDER BUMP METALLIZATION, WHERE THE SECOND WIDTH IS LESS THAN THE FIRST WIDTH — 1410

1400

FORM SOLDER INTERCONNECTS OVER THE PLURALITY OF PILLAR INTERCONNECTS — 1415

FIG. 14

INTEGRATED DEVICE COMPRISING PILLAR INTERCONNECTS WITH VARIABLE WIDTHS

FIELD

Various features relate to integrated devices.

BACKGROUND

A package may include a substrate and integrated devices. These components are coupled together to provide a package that may perform various functions. The performance of a package and its components may depend on the quality of the joints between various components of the package. There is an ongoing need to provide packages that include robust and reliable joints between components.

SUMMARY

Various features relate to integrated devices.

One example provides an integrated device comprising a die portion that includes a plurality of pads and a plurality of under bump metallization interconnects coupled to the plurality of pads, where the plurality of under bump metallization interconnects comprises a first under bump metallization interconnect. The integrated device includes a plurality of pillar interconnects coupled to the plurality of under bump metallization interconnects, where the plurality of pillar interconnects includes a first pillar interconnect. The first pillar interconnect includes a first width that corresponds to a widest part of the first pillar interconnect, and a second width that corresponds to a part of the first pillar interconnect that is vertically farthest away from the first under bump metallization interconnect, wherein the second width is less than the first width.

Another example provides a package comprising a substrate and an integrated device. The integrated device includes a plurality of under bump metallization interconnects comprising a first under bump metallization interconnect, and a plurality of pillar interconnects comprising a first pillar interconnect. The first pillar interconnect is coupled to the first under bump metallization interconnect. The first pillar interconnect comprises a first width that corresponds to a widest part of the first pillar interconnect, and a second width that corresponds to a part of the first pillar interconnect that is vertically farthest away from the first under bump metallization interconnect, where the second width is less than the first width. The integrated device is coupled to the substrate through the plurality of pillar interconnects and the plurality of solder interconnects.

Another example provides a method for fabricating an integrated device. The method provides a die portion that includes a plurality of pads and a plurality of under bump metallization interconnects coupled to the plurality of pads. The method forms a plurality of pillar interconnects over the plurality of under bump metallization interconnects. Forming the plurality of pillar interconnects comprises forming a first pillar interconnect such that the first pillar interconnect comprises a first width that corresponds to a widest part of the first pillar interconnect and a second width that corresponds to a part of the first pillar interconnect that is vertically farthest away from the first under bump metallization interconnect, wherein the second width is less than the first width.

BRIEF DESCRIPTION OF THE DRAWINGS

Various features, nature and advantages may become apparent from the detailed description set forth below when taken in conjunction with the drawings in which like reference characters identify correspondingly throughout.

FIG. 8 illustrates a profile cross sectional view of an exemplary package comprising an integrated device that includes pillar interconnects, where the integrated device is coupled to a substrate.

FIGS. 10A-10C illustrate an exemplary sequence for fabricating an integrated device that includes pillar interconnects.

FIGS. 12A-12D illustrate an exemplary sequence for fabricating an integrated device that includes pillar interconnects.

FIG. 13 illustrates an exemplary flow diagram of a method for fabricating an integrated device that includes pillar interconnects.

FIG. 14 illustrates an exemplary flow diagram of a method for fabricating an integrated device that includes pillar interconnects.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate and an integrated device. The integrated device includes a plurality of under bump metallization interconnects comprising a first under bump metallization interconnect, and a plurality of pillar interconnects comprising a first pillar interconnect. The first pillar interconnect is coupled to the first under bump metallization interconnect. The first pillar interconnect comprises a first width that corresponds to a widest part of the first pillar interconnect, and a second width that corresponds to a part of the first pillar interconnect that is vertically farthest away from the first under bump metallization interconnect, where the second width is less than the first width. The integrated device is coupled to the substrate through the plurality of pillar interconnects and the plurality of solder interconnects. The different and/or varying widths may allow more surface area for the solder interconnects to couple to, thus providing a more robust and reliable joint between the integrated device and the substrate. The increased surface area may also allow more solder interconnects to be located between the first pillar interconnect and the substrate, without causing a short between neighboring interconnects of the substrate. The use of varying widths of the pillar interconnects also helps reduces stress on the dielectric layers near the pillar interconnects, which reduces the likelihood of delamination of the dielectric layers. The more robust and reliable joint helps provide a more reliable electrical path for currents and/or signals traveling between the integrated device and the substrate, which can lead to improved performances for the integrated device and the package.

Exemplary Integrated Device Comprising a Pillar Interconnect

Figure 1:
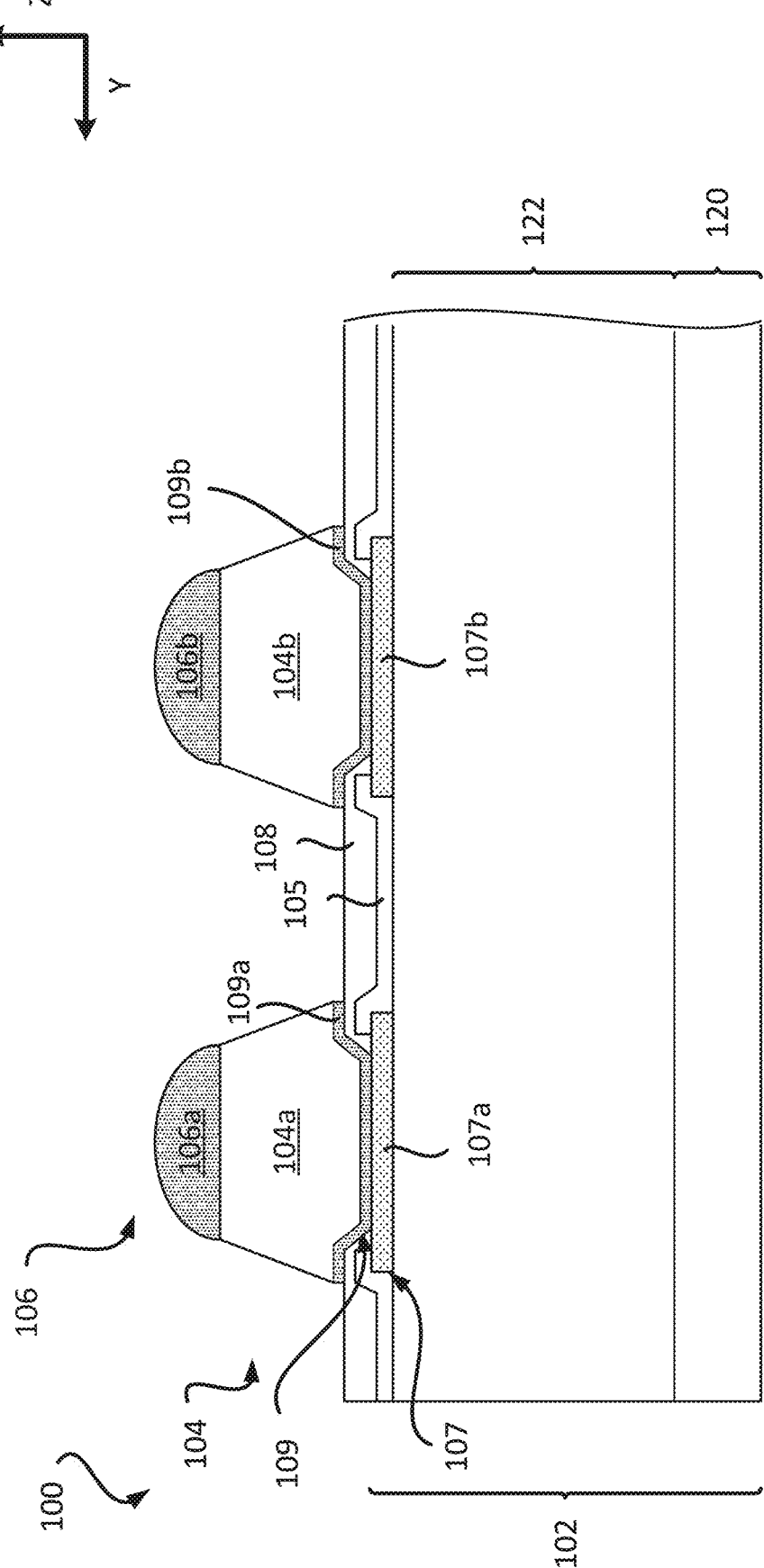
FIG. 1 illustrates a profile cross sectional view of an exemplary integrated device that includes pillar interconnects.

FIG. 1 illustrates a profile cross sectional view of an integrated device 100 that includes pillar interconnects with variable widths. The integrated device 100 includes a die portion 102, a plurality of pillar interconnects 104 and a plurality of solder interconnects 106. The plurality of pillar interconnects 104 is coupled to the die portion 102. The plurality of solder interconnects 106 is coupled to the plurality of pillar interconnects 104. At least one pillar interconnect from the plurality of pillar interconnects 104 includes a variable width (e.g., profile shape with variable widths). For example, at least one pillar interconnect from the plurality of pillar interconnects 104 includes a first portion with a first width and a second portion with a second width. The second width may be less than the first width. As will be further described below, the portion of the pillar interconnect that is coupled to a solder interconnect may have a width that is less than the portion of the pillar interconnect that is coupled to an under bump metallization interconnect. The different width creates extra surface area for solder interconnects to couple to. The different width also creates more space to accommodate more solder interconnect, while reducing the likelihood of shorting with a nearby interconnect. The extra surface area of the pillar interconnect and/or the additional volume of solder interconnect helps provide a more robust and reliable joint for the integrated device, thus providing a more robust and reliable electrical path for current(s) to and from the integrated device. The use of the variable widths for the pillar interconnects helps reduce stress (e.g., reduce stress in dielectric layers), which helps reduce delamination risk (e.g., help reduce risk of delamination of dielectric layers). The integrated device 100 may include a flip chip.

The die portion 102 includes a die substrate 120, an interconnect portion 122, a passivation layer 105, a passivation layer 108, a plurality of pads 107, a passivation layer 108 and a plurality of under bump metallization interconnects 109. The die substrate 120 may include silicon (Si). A plurality of cells (e.g., logic cells) and/or a plurality of transistors (not shown) may be formed in and/or over the die substrate 120. Different implementations may use different types of transistors, such as a field effect transistor (FET), planar FET, finFET, and a gate all around FET. In some implementations, a front end of line (FEOL) process may be used to fabricate the plurality of cells (e.g., logic cells) and/or transistors in and/or over the die substrate 120. The interconnect portion 122 is located over and coupled to the die substrate 120. The interconnect portion 122 may be coupled to the plurality of cells and/or transistors located in and/or over the die substrate 120. The interconnect portion 122 (e.g., die interconnect portion) may include a plurality of die interconnects (not shown) that are coupled to the plurality of cells and/or transistors. In some implementations, a back end of line (BEOL) process may be used to fabricate the interconnect portion 122.

The passivation layer 105 is located over and coupled to the interconnect portion 122. The passivation layer 105 may be a hard passivation layer. The passivation layer 108 is located over the passivation layer 105. The passivation layer 108 may include a polymer passivation layer. The plurality of pads 107 is located over the interconnect portion 122. The plurality of pads 107 may be coupled to die interconnects of the interconnect portion 122. In some implementations, the passivation layer 105, the passivation layer 108 and/or the plurality of pads 107 may be considered part of the interconnect portion 122. In some implementations, a back end of line (BEOL) process may be used to fabricate the passivation layer 105, the passivation layer 108 and the plurality of pads 107. The plurality of under bump metallization interconnects 109 is coupled to the plurality of pads 107. The plurality of under bump metallization interconnects 109 may be located over the plurality of pads 107. In some implementations, there may be additional interconnects between the plurality of pads 107 and the plurality of under bump metallization interconnects 109. For example, there may be metallization interconnects between the plurality of pads 107 and the plurality of under bump metallization interconnects 109. Examples of metallization interconnects include redistribution interconnects. In some implementations, the plurality of under bump metallization interconnects 109 may be coupled to the plurality of pads 107 through metallization interconnects (e.g., redistribution interconnects).

The plurality of pillar interconnects 104 may be coupled to the die portion 102. The plurality of pillar interconnects 104 may be coupled to the plurality of under bump metallization interconnects 109. The plurality of pillar interconnects 104 may be coupled to the die portion 102 through the plurality of under bump metallization interconnects 109. The plurality of pillar interconnects 104 may be a means for pillar interconnection. The plurality of under bump metallization interconnects 109 may be a means for under bump metallization interconnection.

The plurality of pads 107 includes a first pad 107a and a second pad 107b. The plurality of under bump metallization interconnects 109 includes a first under bump metallization interconnect 109a and a second under bump metallization interconnect 109b. The plurality of pillar interconnects 104 includes a first pillar interconnect 104a and a second pillar interconnect 104b. The plurality of solder interconnect 106 includes a first solder interconnect 106a and a second solder interconnect 106b.

The first under bump metallization interconnect 109a is coupled to the first pad 107a. The first pillar interconnect 104a is coupled to the first under bump metallization interconnect 109a. The first solder interconnect 106a is coupled to the first pillar interconnect 104a. The width of the widest part of the first pillar interconnect 104a may be equal or less than the width of the first under bump metallization interconnect 109a. It is noted that in some implementations, the first pillar interconnect 104a is coupled to the first under bump metallization interconnect 109a through at least one metallization interconnect. That is, at least one metallization interconnect (e.g., redistribution interconnect) may be located between the first pillar interconnect 104a and the first under bump metallization interconnect 109a.

The second under bump metallization interconnect 109b is coupled to the second pad 107b. The second pillar interconnect 104b is coupled to the second under bump metallization interconnect 109b. The second solder interconnect 106b is coupled to the second pillar interconnect 104b. The width of the widest part of the second pillar interconnect 104b may be equal or less than the width of the second under bump metallization interconnect 109b. It is noted that in some implementations, the second pillar interconnect 104b is coupled to the second under bump metallization interconnect 109b through at least one metallization interconnect. That is, at least one metallization interconnect (e.g., redistribution interconnect) may be located between the second pillar interconnect 104b and the second under bump metallization interconnect 109b.

Figure 2:
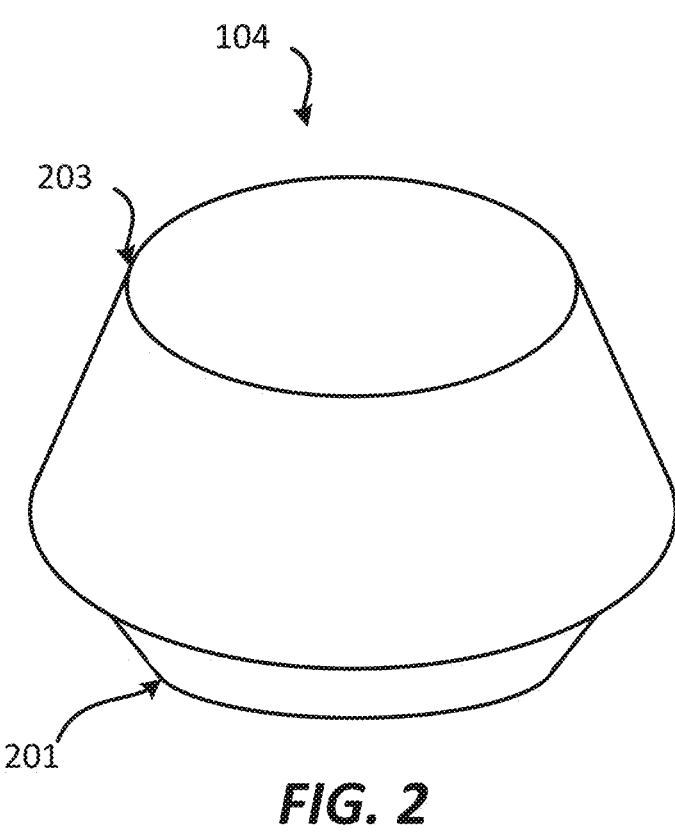
FIG. 2 illustrates an exemplary pillar interconnect.

FIG. 2 illustrates an exemplary view of a pillar interconnect 104. The pillar interconnect 104 of FIG. 2 may represent any of the pillar interconnects from the plurality of pillar interconnects 104 from FIG. 1. For example, the pillar interconnect 104 may represent the first pillar interconnect 104a and/or the second pillar interconnect 104b. As shown in FIG. 2, the pillar interconnect 104 includes a first pillar interconnect portion 201 and a second pillar interconnect portion 203. The first pillar interconnect portion 201 and the second pillar interconnect portion 203 may be continuous portions and/or contiguous portions of the pillar interconnect 104. The first pillar interconnect portion 201 may represent a base of the pillar interconnect 104. The first pillar interconnect portion 201 may represent and/or include a bottom portion of the pillar interconnect 104. The first pillar interconnect portion 201 may be coupled to an under bump metallization interconnect (e.g., 109a, 109b). The second pillar interconnect portion 203 may be configured to be coupled to a solder interconnect (e.g., 106a, 106b). The second pillar interconnect portion 203 may represent and/or include a top portion of the pillar interconnect 104. The pillar interconnect 104 may include a diagonal surface. For example, the second pillar interconnect portion 203 of the pillar interconnect 104, may include a diagonal surface. The diagonal surface may be diagonal relative to the top surface of the pillar interconnect 104. The diagonal surfaces may be diagonal relative to the surface of the passivation layer 108.

Figure 3:
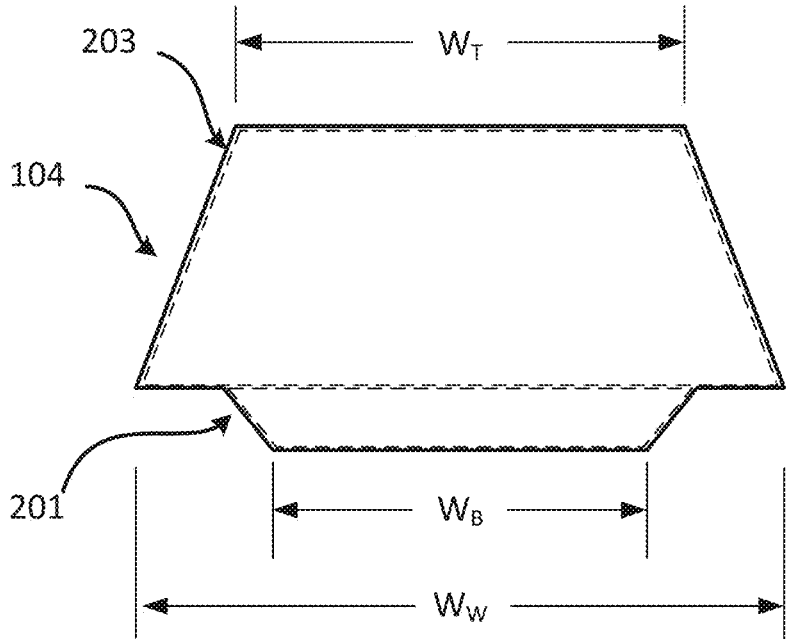
FIG. 3 illustrates a profile cross sectional view of an exemplary pillar interconnect.

FIG. 3 illustrates a profile cross sectional view of the pillar interconnect 104. As mentioned above, the pillar interconnect 104 includes the first pillar interconnect portion 201 and the second pillar interconnect portion 203. The first pillar interconnect portion 201 may include a bottom width ($W_B$). The second pillar interconnect portion 203 may include a top width ($W_T$) and a widest width ($W_W$). The widest width ($W_W$) may be a width that corresponds to the widest part of the first pillar interconnect 104. The top width ($W_T$) may be a width that corresponds to a part of the pillar interconnect 104 that is vertically farthest away from an under bump metallization interconnect. The top width ($W_T$) is less than the widest width ($W_W$). A bottom portion and a widest portion of the pillar interconnect 104 may be coupled (e.g., directly touching) to an under bump metallization interconnect.

As shown in FIG. 3, the first pillar interconnect portion 201 may have a profile cross section that includes a first trapezoid shape. The second pillar interconnect portion 203 may have a profile cross section that includes a second trapezoid shape. Thus, the pillar interconnect 104 may include a profile cross section that includes the first trapezoid shape and the second trapezoid shape. The second trapezoid shape may be an inverted trapezoid shape relative to the first trapezoid shape. Similarly, the first trapezoid shape may be an inverted trapezoid shape relative to the second trapezoid shape.

The second trapezoid shape of the second pillar interconnect portion 203 includes a top portion and a bottom portion, where the top portion of the second trapezoid shape is farther away from an under bump metallization interconnect than the bottom portion of the second trapezoid shape is from the under bump metallization interconnect. The bottom portion of the trapezoid shape has a first width (e.g., widest width ($W_W$)). The top portion of the trapezoid shape has a second width (e.g., top width ($W_T$)).

It is noted that the first pillar interconnect portion 201 and the second pillar interconnect portion 203 may be considered as one portion or as two or more separate portions. There may or may not be an interface between the first pillar interconnect portion 201 and the second pillar interconnect portion 203. The second pillar interconnect portion 203 may include the widest portion of the pillar interconnect 104 and a portion that is vertically farthest away from an under bump metallization interconnect to which the pillar interconnect 104 is coupled to.

Figure 4:
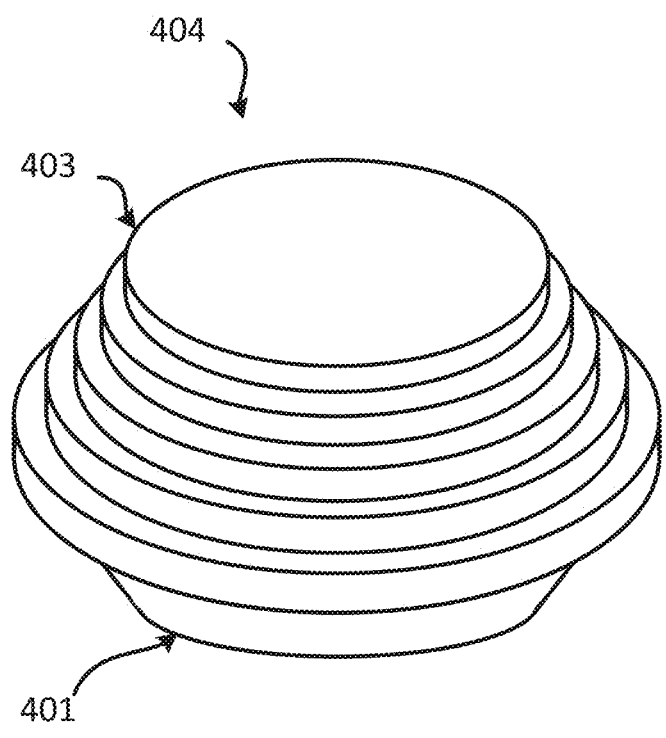
FIG. 4 illustrates another exemplary pillar interconnect.

FIG. 4 illustrates an exemplary view of another pillar interconnect 404. The pillar interconnect 404 of FIG. 4 may be used in addition to or in lieu of the pillar interconnects from the plurality of pillar interconnects 104 from FIG. 1. As shown in FIG. 4, the pillar interconnect 404 includes a first pillar interconnect portion 401 and a second pillar interconnect portion 403. The first pillar interconnect portion 401 and the second pillar interconnect portion 403 may be continuous portions and/or contiguous portions of the pillar interconnect 404. The first pillar interconnect portion 401 may represent a base of the pillar interconnect 404. The first pillar interconnect portion 401 may represent and/or include a bottom portion of the pillar interconnect 404. The first pillar interconnect portion 401 may be coupled to an under bump metallization interconnect (e.g., 109a, 109b). The second pillar interconnect portion 403 may be configured to be coupled to a solder interconnect (e.g., 106a, 106b). The second pillar interconnect portion 403 may represent and/or include a top portion of the pillar interconnect 404. The pillar interconnect 404 may include a diagonal surface. For example, the second pillar interconnect portion 403 of the pillar interconnect 404, may include a diagonal surface. The diagonal surface may be diagonal to the top surface of the pillar interconnect 404.

Figure 5:
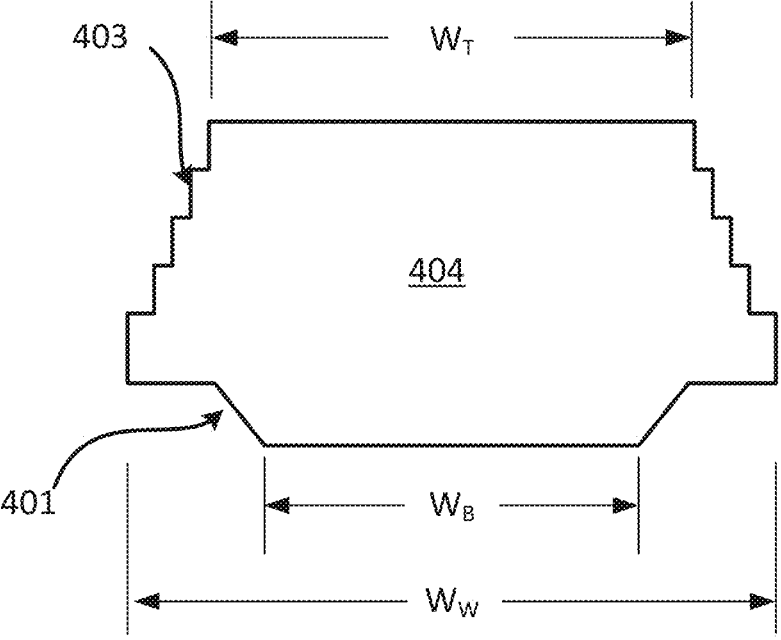
FIG. 5 illustrates a profile cross sectional view of an exemplary pillar interconnect.

FIG. 5 illustrates a profile cross sectional view of the pillar interconnect 404. The pillar interconnect 404 includes the first pillar interconnect portion 401 and the second pillar interconnect portion 403. The first pillar interconnect portion 401 may include a bottom width ($W_B$). The second pillar interconnect portion 403 may include a top width ($W_T$) and a widest width ($W_W$). The widest width ($W_W$) may be a width that corresponds to the widest part of the first pillar interconnect 404. The top width ($W_T$) may be a width that corresponds to a part of the pillar interconnect 404 that is vertically farthest away from an under bump metallization interconnect. The top width ($W_T$) is less than the widest width ($W_W$). A bottom portion and a widest portion of the pillar interconnect 404 may be coupled (e.g., directly touching) to an under bump metallization interconnect.

As shown in FIG. 5, part of the pillar interconnect 404 includes a step pyramid shape. For example, the second pillar interconnect portion 403 has a side profile cross section of a step pyramid. The step pyramid shape may mimic and/or replicate the shape of a diagonal surface for the pillar interconnect. The step pyramid may have the same benefits as described for the pillar interconnect 104. Different implementations, may have different numbers of steps in the step pyramid shape.

It is noted that the first pillar interconnect portion 401 and the second pillar interconnect portion 403 may be considered as one portion or as two or more separate portions. There may or may not be an interface between the first pillar interconnect portion 401 and the second pillar interconnect portion 403. The second pillar interconnect portion 403 may include the widest portion of the pillar interconnect 404 and a portion that is vertically farthest away from an under bump metallization interconnect to which the pillar interconnect 404 is coupled to.

Figure 6:
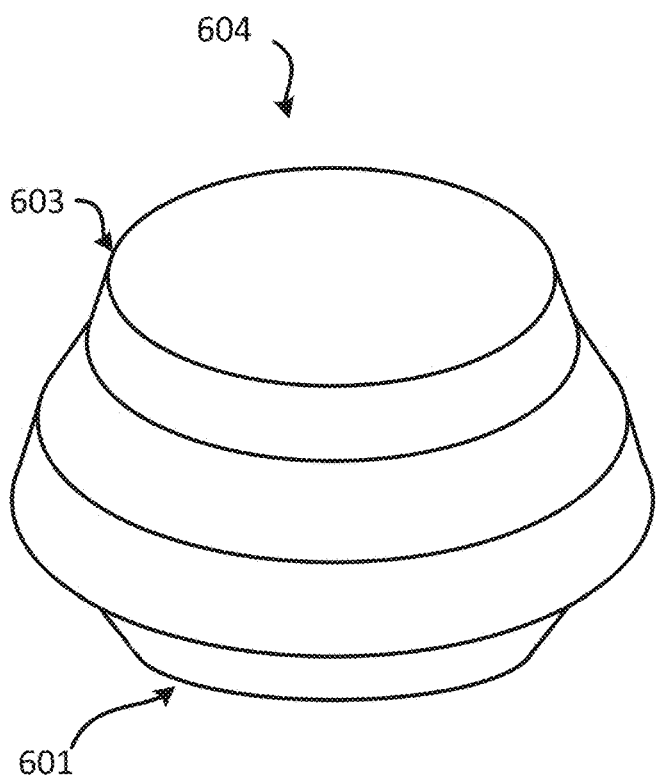
FIG. 6 illustrates another exemplary pillar interconnect.

FIG. 6 illustrates an exemplary view of another pillar interconnect 604. The pillar interconnect 604 of FIG. 6 may be used in addition to or in lieu of the pillar interconnects from the plurality of pillar interconnects 104 from FIG. 1. As shown in FIG. 6, the pillar interconnect 604 includes a first pillar interconnect portion 601 and a second pillar interconnect portion 603. The first pillar interconnect portion 601 and the second pillar interconnect portion 603 may be continuous portions and/or contiguous portions of the pillar interconnect 604. The first pillar interconnect portion 601 may represent a base of the pillar interconnect 604. The first pillar interconnect portion 601 may represent and/or include a bottom portion of the pillar interconnect 604. The first pillar interconnect portion 601 may be coupled to an under bump metallization interconnect (e.g., 109a, 109b). The second pillar interconnect portion 603 may be configured to be coupled to a solder interconnect (e.g., 106a, 106b). The second pillar interconnect portion 603 may represent and/or include a top portion of the pillar interconnect 604. The pillar interconnect 604 may include several diagonal surfaces. For example, the second pillar interconnect portion 603 of the pillar interconnect 604, may include a first diagonal surface having a first angle, a second diagonal surface having a second angle and a third diagonal surface having a third angle. The diagonal surfaces may be diagonal relative to the top surface of the pillar interconnect 604. The diagonal surfaces may be diagonal relative to the surface of the passivation layer 108.

Figure 7:
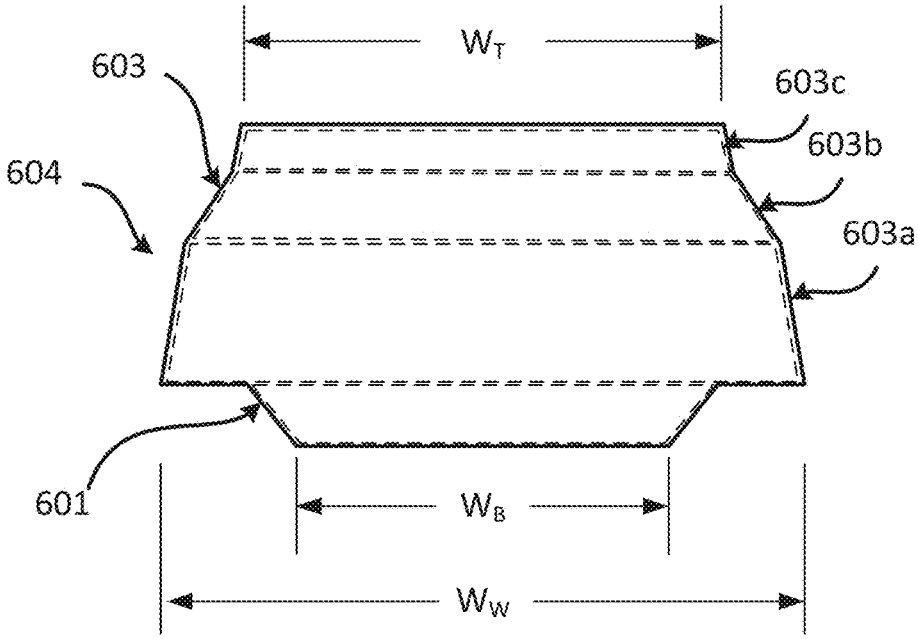
FIG. 7 illustrates a profile cross sectional view of an exemplary pillar interconnect.

FIG. 7 illustrates a profile cross sectional view of the pillar interconnect 604. The pillar interconnect 604 includes the first pillar interconnect portion 601 and the second pillar interconnect portion 603. The first pillar interconnect portion 601 may include a bottom width ($W_B$). The second pillar interconnect portion 603 may include a top width ($W_T$) and a widest width ($W_W$). The widest width ($W_W$) may be a width that corresponds to the widest part of the first pillar interconnect 604. The top width ($W_T$) may be a width that corresponds to a part of the pillar interconnect 604 that is vertically farthest away from an under bump metallization interconnect. The top width ($W_T$) is less than the widest width ($W_W$). A bottom portion and a widest portion of the pillar interconnect 604 may be coupled (e.g., directly touching) to an under bump metallization interconnect.

FIG. 7 illustrates that part of the pillar interconnect 604 includes a step pyramid shape. For example, the second pillar interconnect portion 603 has a side profile cross section of a step pyramid. The step pyramid shape may mimic and/or replicate the shape of a diagonal surface for the pillar interconnect. Each step of the pillar interconnect 604 may have a diagonal surface. The angle of the diagonal surface for each step may be different and/or may be the same. Different implementations, may have different numbers of steps in the step pyramid shape.

As shown in FIG. 7, the first pillar interconnect portion 601 may have a profile cross section that includes a first trapezoid shape. The second pillar interconnect portion 603 may include a second pillar interconnect portion 603a, a second pillar interconnect portion 603b and a second pillar interconnect portion 603c. The second pillar interconnect portion 603a may have a profile cross section that includes a second trapezoid shape. The second pillar interconnect portion 603b may have a profile cross section that includes a third trapezoid shape. The second pillar interconnect portion 603c may have a profile cross section that includes a fourth trapezoid shape. The pillar interconnect 104 may include a profile cross section that includes the first trapezoid shape, the second trapezoid shape, the third trapezoid shape and/or the fourth trapezoid shape. The second trapezoid shape, the third trapezoid shape and/or the fourth trapezoid shape may be an inverted trapezoid shape relative to the first trapezoid shape. Similarly, the first trapezoid shape may be an inverted trapezoid shape relative to the second trapezoid shape, the third trapezoid shape and/or the fourth trapezoid shape.

It is noted that the first pillar interconnect portion 601 and the second pillar interconnect portion 603 may be considered as one portion or as two or more separate portions. There may or may not be an interface between the first pillar interconnect portion 601 and the second pillar interconnect portion 603. The second pillar interconnect portion 603 may include the widest portion of the pillar interconnect 604 and a portion that is vertically farthest away from an under bump metallization interconnect to which the pillar interconnect 604 is coupled to. It is noted that the width described in the disclosure may be used to describe a diameter of a pillar interconnect and/or a diameter of a pillar interconnect portion. Thus, for example, the widest width may correspond to a widest diameter, a top width may correspond to a top diameter, and/or a bottom width may correspond to a bottom diameter.

The integrated device 100 may be implemented in a package. FIG. 8 illustrates a package 800 that includes a substrate 802, the integrated device 100 and an encapsulation layer 808. The substrate 802 includes at least one dielectric layer 820, a plurality of interconnects 822, and a solder resist layer 826. A plurality of solder interconnects 830 may be coupled to the plurality of interconnects 822 of the substrate 802. The integrated device 100 is coupled to a first surface (e.g., top surface) of the substrate 802 through the plurality of pillar interconnects 104 and the plurality of solder interconnects 106. The encapsulation layer 808 may be located over and/or around the integrated device 100 and/or the substrate 802. The encapsulation layer 808 is coupled to the integrated device 100 and/or the substrate 802. The encapsulation layer 808 may at least partially encapsulate the integrated device 100. The encapsulation layer 808 may include a mold, a resin and/or an epoxy. The encapsulation layer 808 may be a means for encapsulation. The encapsulation layer 808 may be provided by using a compression and transfer molding process, a sheet molding process, or a liquid molding process. It is noted that the integrated device 100 may be coupled to the substrate 802 through a plurality of pillar interconnects 404 and/or a plurality of pillar interconnects 604, in addition to or in lieu of the plurality of pillar interconnects 104.

Figure 9:
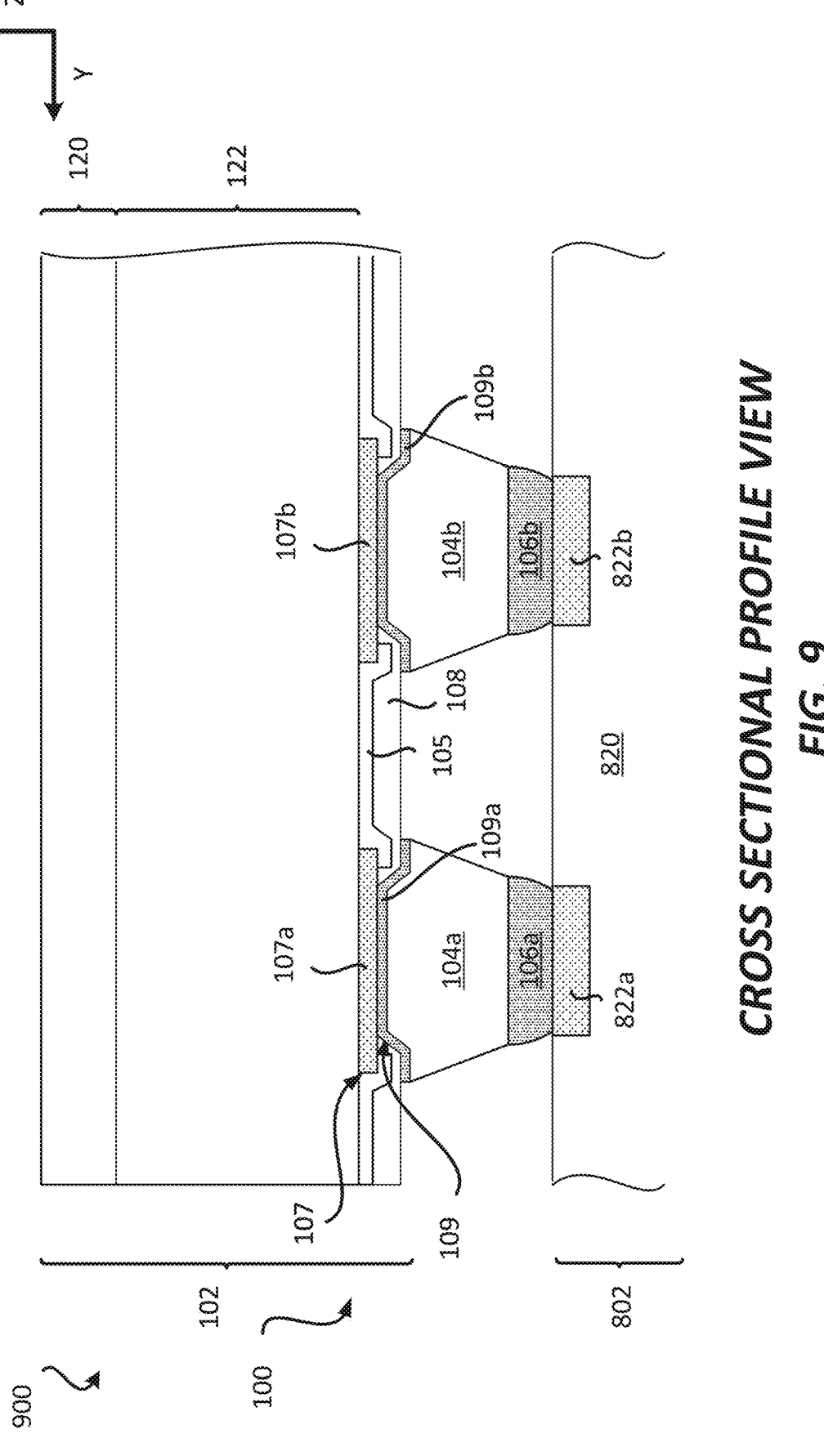
FIG. 9 illustrates a close-up view of an exemplary package comprising an integrated device that includes pillar interconnects, where the integrated device is coupled to a substrate.

FIG. 9 illustrates a close-up view of how an integrated device may be coupled to a substrate. FIG. 9 illustrates a portion of the package 800 that includes the integrated device 100 and the substrate 802. The integrated device 100 is coupled to the substrate 802 through the plurality of pillar interconnects 104 and the plurality of solder interconnects 106. However, as mentioned above, the integrated device 100 may be coupled to the substrate 802 through a plurality of pillar interconnects 404 and/or a plurality of pillar interconnects 604, in addition to or in lieu of the plurality of pillar interconnects 104.

As shown in FIG. 9, the first pillar interconnect 104a is coupled to the first solder interconnect 106a. The first solder interconnect 106a is coupled to a first interconnect 822a of the substrate 802. The first solder interconnect 106a may include an intermetallic compound (IMC) (not shown). The intermetallic compound may be formed when metal from the first interconnect 822a and/or the first pillar interconnect 104a diffuses in the solder interconnect 106a.

The second pillar interconnect 104b is coupled to the second solder interconnect 106b. The second solder interconnect 106b is coupled to a second interconnect 822b of the substrate 802. The second solder interconnect 106b may include an intermetallic compound (IMC). The intermetallic compound may be formed when metal from the second interconnect 822b and/or the second pillar interconnect 104b diffuses in the solder interconnect 106b. As mentioned above, the use of the variable widths for the pillar interconnects helps reduce stress (e.g., reduce stress in dielectric layers), which helps reduce delamination risk (e.g., help reduce risk of delamination of dielectric layers). In particular, the side of the pillar interconnect that is vertically closest to the substrate 802 and/or vertically farthest away from the interconnect portion 122, the passivation layer 105, the plurality of pads 107, the passivation layer 108, and the plurality of under bump metallization interconnects 109 is more likely to deform and/or bend because that particular side of the pillar interconnect is smaller in size than the side that is coupled to the under bump metallization interconnects 109, resulting in less energy being applied to the die side of the pillar interconnect, which helps reduce delamination risk of the dielectric layers of the integrated device 100.

An integrated device (e.g., 100) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 100) may include at least one electronic circuit (e.g., first electronic circuit, second electronic circuit, etc. . . . ). An integrated device may be an example of an electrical component and/or electrical device. In some implementations, an integrated device may be a chiplet. A chiplet may be fabricated using one or more processes that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

Having described an integrated device with pillar interconnects, a method for fabricating an integrated device will now be described below.

Figure 10C:
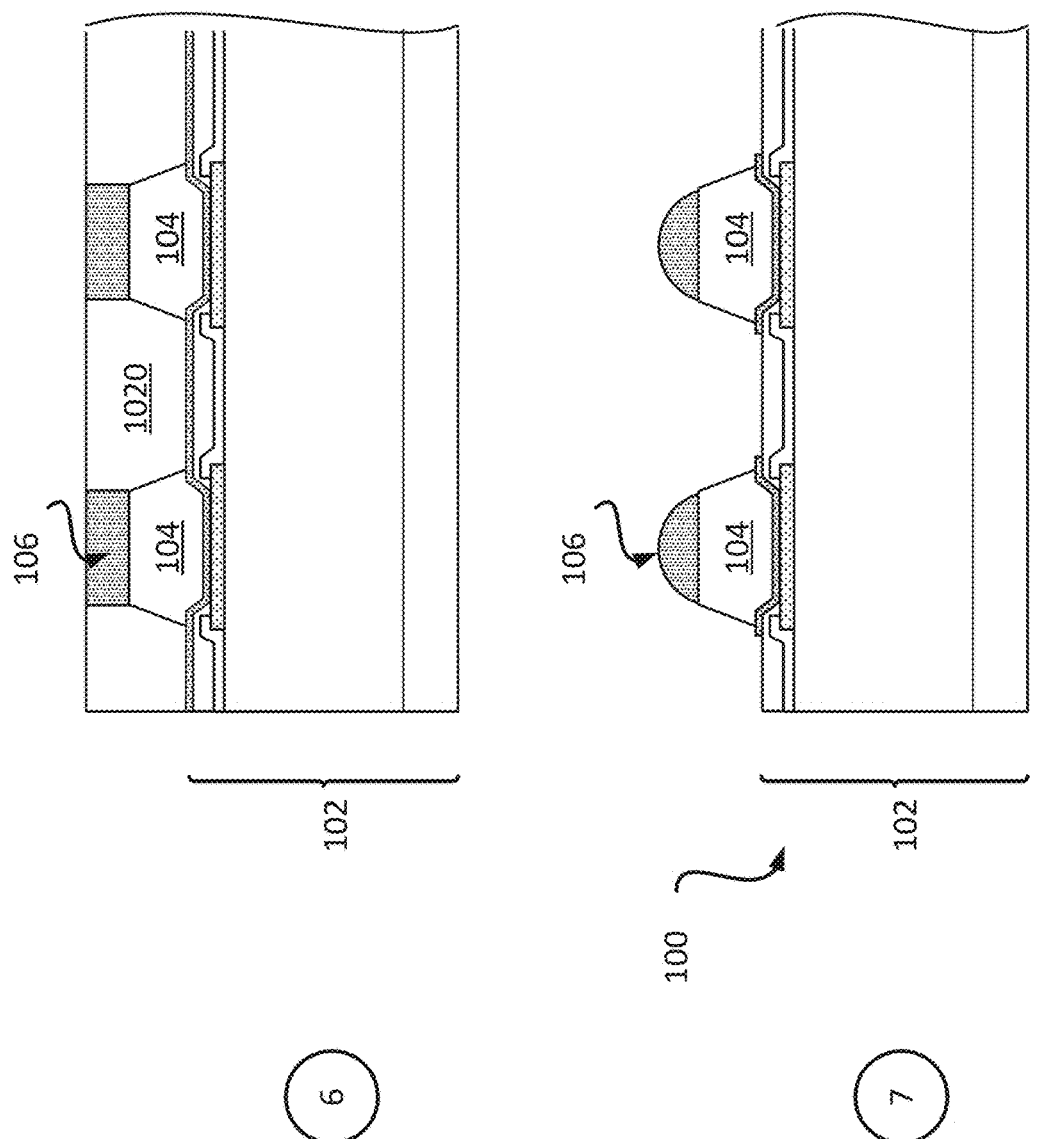

Exemplary Sequence for Fabricating an Integrated Device Comprising a Pillar Interconnect In some implementations, fabricating an integrated device includes several processes. FIGS. 10A-10C illustrate an exemplary sequence for providing or fabricating an integrated device comprising pillar interconnects with varying widths. In some implementations, the sequence of FIGS. 10A-10C may be used to provide or fabricate the integrated device 100 of FIG. 1. However, the process of FIGS. 10A-10C may be used to fabricate any of the integrated devices described in the disclosure.

It should be noted that the sequence of FIGS. 10A-10C may combine one or more stages in order to simplify and/or clarify the sequence for providing or fabricating an integrated device. In some implementations, the order of the processes may be changed or modified. In some implementations, one or more of processes may be replaced or substituted without departing from the scope of the disclosure.

Stage 1, as shown in FIG. 10A, illustrates a state after a die portion 102 is provided. The die portion 102 may include a die substrate 120, an interconnect portion 122, a passivation layer 105, a plurality of pads 107, a passivation layer 108, and a plurality of under bump metallization interconnects 109. The die portion 102 may include a bare die (e.g., semiconductor bare die). Providing the die portion 102 may include fabricating the die portion. The die portion 102 may be fabricated using FEOL and BEOL fabrication processes.

Stage 2 illustrates a state after a first photo resist layer 1000 is formed over the die portion 102 and patterned to include a plurality of openings 1001 in the first photo resist layer 1000. The first photo resist layer 1000 may include a positive photo resist layer. However, in some implementations, the first photo resist layer 1000 may include a negative photo resist layer. A coating process, a masking process and an exposure process that are part of a photolithography process may be used to form and define the pattern of the first photo resist layer 1000. The plurality of openings 1001 may include a profile shape that includes a trapezoid shape. For example, the plurality of openings 1001 may have a top width at the top of the first photo resist layer 1000 that is less (e.g., smaller) than a bottom width at the bottom of the first photo resist layer 1000. The plurality of openings 1001 may have side walls than are diagonal. The diagonal side walls of the plurality of openings 1001 may be achieved by shinning a light (e.g., using a laser) at one or more angles (e.g., angles that are non-perpendicular angles to a surface of the first photo resist layer 1000). This approach helps create openings with a top width at the top of the first photo resist layer 1000 that is less (e.g., smaller) than a bottom width at the bottom of the first photo resist layer 1000.

Stage 3 illustrates a state after a plurality of pillar interconnects 104 are formed through the plurality of openings 1001 of the first photo resist layer 1000. The plurality of pillar interconnects 104 may be formed over the plurality of under bump metallization interconnects 109 (or under bump metallization layer). A plating process may be used to form the plurality of pillar interconnects 104. The plurality of pillar interconnects 104 may include a side profile cross section that includes the shape of a trapezoid. For example, a top portion of a pillar interconnect may have a smaller width (e.g., diameter) than a bottom portion of the pillar interconnect. The plurality of pillar interconnects 104 may have a diagonal surface.

Stage 4, as shown in FIG. 10B, illustrates a state after the first photo resist layer 1000 is removed from the die portion 102. The first photo resist layer 1000 may be removed through a development process. The first photo resist layer 1000 may be removed through a rinsing process.

Stage 5 illustrates a state after a second photo resist layer 1020 is formed over the die portion 102 and patterned. The second photo resist layer 1020 may be formed around the plurality of pillar interconnects 104. A coating process, a masking process and an exposure process that are part of a photolithography process may be used to form and define the pattern of the second photo resist layer 1020. There may be a plurality of openings 1003 in the second photo resist layer 1020. The plurality of openings 1003 may be located over the plurality of pillar interconnects 104.

Stage 6, as shown in FIG. 10C, illustrates a state after a plurality of solder interconnects 106 is formed over the plurality of pillar interconnects through the plurality of openings 1003 of the third photo resist layer 1020. In some implementations, a paste process may be used to formed the plurality of solder interconnects 106. However, the plurality of solder interconnects 106 may be formed differently.

Stage 7 illustrates a state after the second photo resist layer 1020 is removed from the die portion 102. The second photo resist layer 1020 may be removed through a development process. The second photo resist layer 1020 may be removed through a rinsing process. Portions of the under bump metallization interconnects 109 may also be removed. Stage 7 may illustrate an example of an integrated device that includes pillar interconnects that comprises a side profile cross section that includes a trapezoid shape.

Figure 11:
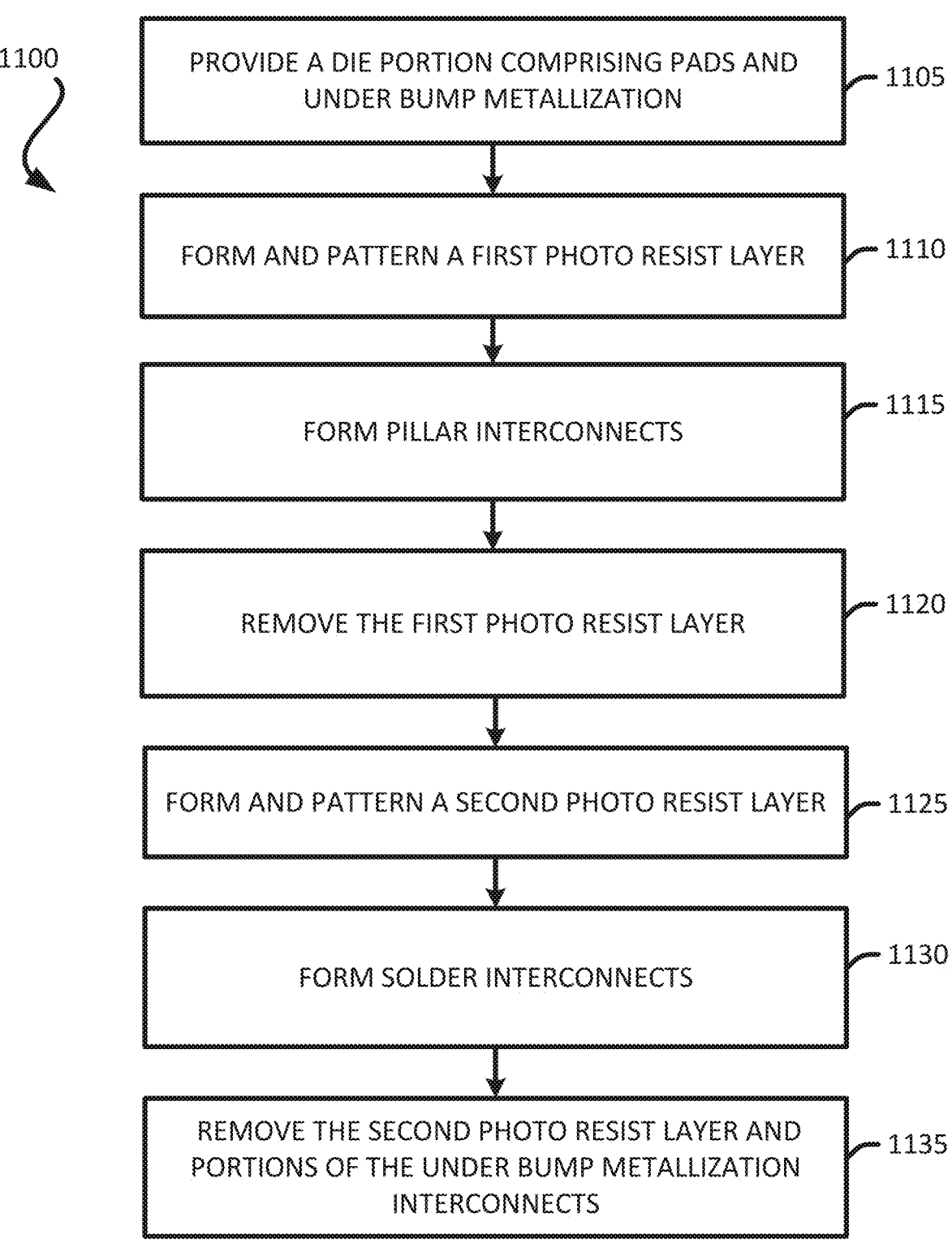
FIG. 11 illustrates an exemplary flow diagram of a method for fabricating an integrated device that includes pillar interconnects.

Exemplary Flow Diagram of a Method for Fabricating an Integrated Device Comprising a Pillar Interconnect In some implementations, fabricating an integrated device includes several processes. FIG. 11 illustrates an exemplary flow diagram of a method 1100 for providing or fabricating an integrated device comprising pillar interconnects. In some implementations, the method 1100 of FIG. 11 may be used to provide or fabricate the integrated device 100 of FIG. 1 described in the disclosure. However, the method 1100 may be used to provide or fabricate any of the integrated devices described in the disclosure.

It should be noted that the method of FIG. 11 may combine one or more processes in order to simplify and/or clarify the method for providing or fabricating an integrated device. In some implementations, the order of the processes may be changed or modified.

The method provides (at 1105) a die portion (e.g., 102). The die portion 102 may include a die substrate 120, an interconnect portion 122, a passivation layer 105, a plurality of pads 107, a passivation layer 108 and a plurality of under bump metallization interconnects 109. The die portion 102 may include a bare die (e.g., semiconductor bare die). Providing the die portion 102 may include fabricating the die portion. The die portion 102 may be fabricated using FEOL and BEOL fabrication processes. Stage 1 of FIG. 10A, illustrates and describes an example of providing a die portion.

The method forms (at 1110) a first photo resist layer (e.g., 1000) over the die portion (e.g., 102). The method may also pattern (at 1110) the first photo resist layer (e.g., 1000). A coating process, a masking process and an exposure process that are part of a photolithography process may be used to form and define the pattern of the first photo resist layer 1000.

Patterning the first photo resist layer may include forming openings (e.g., 1001) in the first photo resist layer 1000. The plurality of openings 1001 may include a profile shape that includes a trapezoid. For example, the plurality of openings 1001 may have a top width at the top of the first photo resist layer 1000 that is less (e.g., smaller) than a bottom width at the bottom of the first photo resist layer 1000. The plurality of openings 1001 may have side walls than are diagonal. The diagonal side walls of the plurality of openings 1001 may be achieved by shinning a light (e.g., using a laser) at one or more angles (e.g., angles that are non-perpendicular angles to a surface of the first photo resist layer 1000). This approach helps create openings with a top width at the top of the first photo resist layer 1000 that is less (e.g., smaller) than a bottom width at the bottom of the first photo resist layer 1000. The first photo resist layer 1000 may include a positive photo resist layer. However, in some implementations, the first photo resist layer 1000 may include a negative photo resist layer. Stage 2 of FIG. 10A, illustrates and describes an example of forming and patterning a first photo resist layer.

The method forms (at 1115) pillar interconnects (e.g., 104). The pillar interconnects 104 may be formed over the plurality of under bump metallization interconnects 109 (or under bump metallization layer). A plating process may be used to form the pillar interconnects 104. The pillar interconnects 104 may be formed through a plurality of openings 1001 of the first photo resist layer 1000. Stage 3 of FIG. 10A, illustrates and describes an example of forming pillar interconnects.

The method removes (at 1120) the first photo resist layer (e.g., 1000). The first photo resist layer 1000 may be removed through a development process. The first photo resist layer 1000 may be removed through a rinsing process. Stage 4 of FIG. 10B, illustrates and describes an example of removing a first photo resist layer.

The method forms (at 1125) a second photo resist layer (e.g., 1020) over the die portion (e.g., 102). The method may also pattern (at 1125) the second photo resist layer (e.g., 1020). A coating process, a masking process and an exposure process that are part of a photolithography process may be used to form and define the pattern of the first photo resist layer 1000. The second photo resist layer 1020 may be formed around the plurality of pillar interconnects 104. A coating process, a masking process and an exposure process that are part of a photolithography process may be used to form and define the pattern of the second photo resist layer 1020. There may be a plurality of openings 1003 in the second photo resist layer 1020. The plurality of openings 1003 may be located over the plurality of pillar interconnects 104. Stage 5 of FIG. 10B, illustrates and describes an example of forming and patterning a second photo resist layer.

The method forms (at 1130) a plurality of solder interconnects (e.g., 106). The plurality of solder interconnects 106 may be formed over the plurality of pillar interconnects through the plurality of openings 1003 of the third photo resist layer 1020. In some implementations, a paste process may be used to formed the plurality of solder interconnects 106. However, the plurality of solder interconnects 106 may be formed differently. Stage 6 of FIG. 10C, illustrates and describes an example of a plurality of solder interconnects formed.

The method removes (at 1135) the second photo resist layer (e.g., 1020) and portions of the under bump metallization interconnect (e.g., 109). The second photo resist layer 1020 may be removed through a development process. The second photo resist layer 1020 may be removed through a rinsing process. Portions of the under bump metallization interconnects 109 may also be removed through an etching process. Stage 7 of FIG. 10C, illustrates and describes an example of a state after a second photo resist layer is removed and portions of an under bump metallization interconnects are removed.

Exemplary Sequence for Fabricating an Integrated Device Comprising a Pillar Interconnect In some implementations, fabricating an integrated device includes several processes. FIGS. 12A-12D illustrate an exemplary sequence for providing or fabricating an integrated device comprising pillar interconnects with varying widths. In some implementations, the sequence of FIGS. 12A-12D may be used to provide or fabricate the integrated device 100 of FIG. 1 that includes the pillar interconnect 604. However, the process of FIGS. 12A-12D may be used to fabricate any of the integrated devices described in the disclosure.

It should be noted that the sequence of FIGS. 12A-12D may combine one or more stages in order to simplify and/or clarify the sequence for providing or fabricating an integrated device. In some implementations, the order of the processes may be changed or modified. In some implementations, one or more of processes may be replaced or substituted without departing from the scope of the disclosure.

Figure 12A:
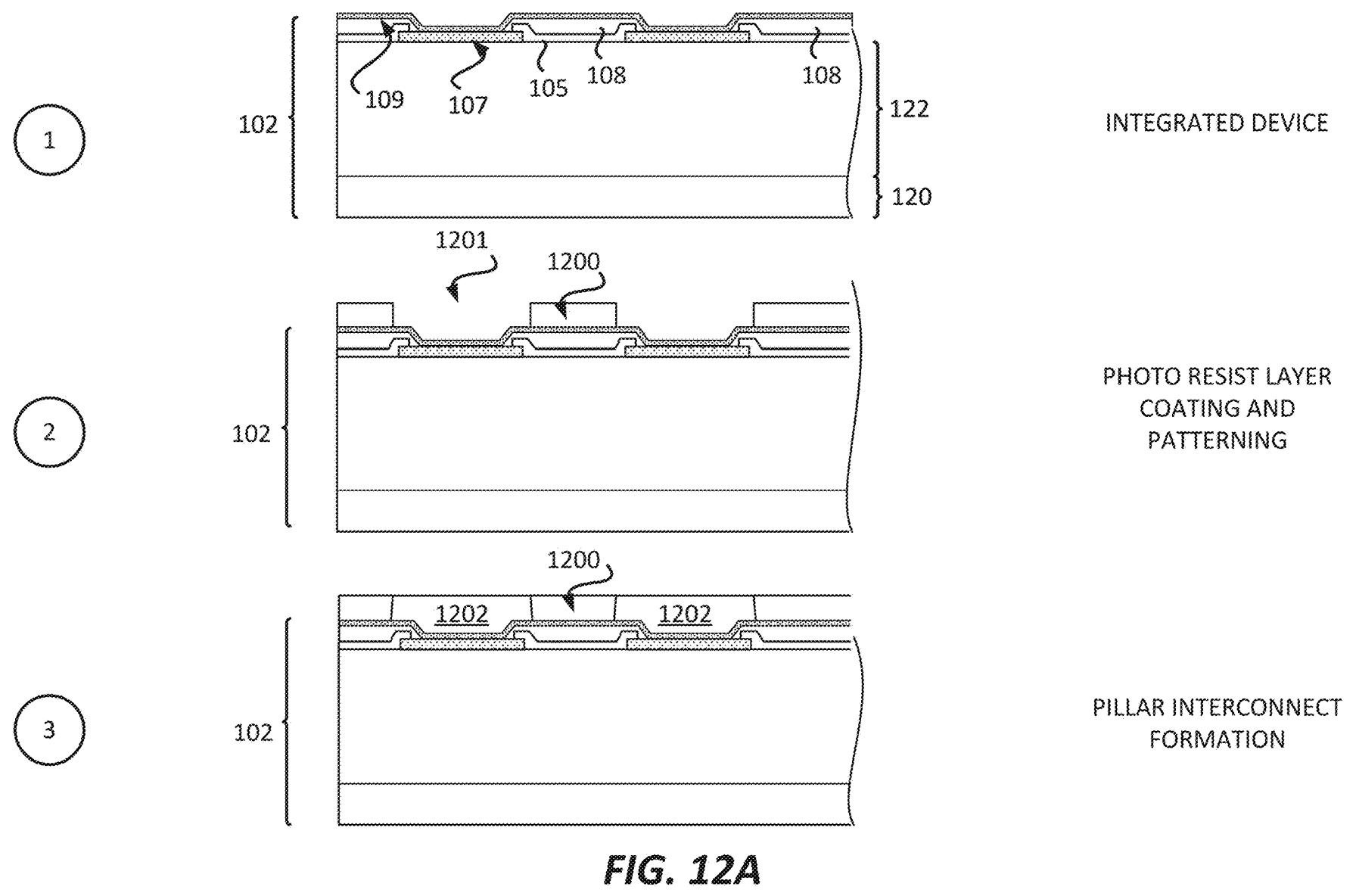

Stage 1, as shown in FIG. 12A, illustrates a state after a die portion 102 is provided. The die portion 102 may include a die substrate 120, an interconnect portion 122, a passivation layer 105, a plurality of pads 107, a passivation layer 108, and a plurality of under bump metallization interconnects 109. The die portion 102 may include a bare die (e.g., semiconductor bare die). Providing the die portion 102 may include fabricating the die portion. The die portion 102 may be fabricated using FEOL and BEOL fabrication processes.

Stage 2 illustrates a state after a first photo resist layer 1200 is formed over the die portion 102 and patterned to include a plurality of openings 1201 in the first photo resist layer 1200. The first photo resist layer 1200 may include a positive photo resist layer. However, in some implementations, the first photo resist layer 1200 may include a negative photo resist layer. A coating process, a masking process and an exposure process that are part of a photolithography process may be used to form and define the pattern of the first photo resist layer 1200.

In some implementations, the plurality of openings 1201 may include a profile shape that includes a rectangular. For example, the plurality of openings 1201 may have a top width at the top of the first photo resist layer 1200 that is about the same as a bottom width at the bottom of the first photo resist layer 1200. The plurality of openings 1201 may have side walls than are vertical.

In some implementations, the plurality of openings 1201 may include a profile shape that includes a trapezoid. For example, the plurality of openings 1201 may have a top width at the top of the first photo resist layer 1200 that is less (e.g., smaller) than a bottom width at the bottom of the first photo resist layer 1200. The plurality of openings 1201 may have side walls than are diagonal. The diagonal side walls of the plurality of openings 1201 may be achieved by shinning a light (e.g., using a laser) at one or more angles (e.g., angles that are non-perpendicular angles to a surface of the first photo resist layer 1200). This approach helps create openings with a top width at the top of the first photo resist layer 1200 that is less (e.g., smaller) than a bottom width at the bottom of the first photo resist layer 1200.

Stage 3 illustrates a state after a plurality of pillar interconnect portions 1202 are formed through the plurality of openings 1201 of the first photo resist layer 1200. The plurality of pillar interconnect portions 1202 may be formed over the plurality of under bump metallization interconnects 109 (or under bump metallization layer). A plating process may be used to form the plurality of pillar interconnect portion 1202. The plurality of pillar interconnect portions 1202 may include a side profile cross section that includes the shape of a trapezoid. For example, a top portion of a pillar interconnect portion may have a width (e.g., diameter) that is less (e.g., smaller) than a bottom portion of the pillar interconnect portion. In some implementations, the plurality of pillar interconnect portions 1202 may have a diagonal side wall. In some implementations, the plurality of pillar interconnect portions 1202 may have a vertical side wall.

Stage 4, as shown in FIG. 12B, illustrates a state after a second photo resist layer 1210 is formed over the first photo resist layer 1200 and patterned to include a plurality of openings 1211 in the second photo resist layer 1200. The plurality of openings 1211 may be located over the plurality of openings 1201. The second photo resist layer 1210 may be similar to the first photo resist layer 1200. A coating process, a masking process and an exposure process that are part of a photolithography process may be used to form and define the pattern of the second photo resist layer 1210.

Stage 5 illustrates a state after a plurality of pillar interconnect portions 1204 are formed through the plurality of openings 1211 of the second photo resist layer 1210. The plurality of pillar interconnect portions 1204 may be formed over the plurality of pillar interconnect portions 1202. A plating process may be used to form the plurality of pillar interconnect portion 1204. The plurality of pillar interconnect portions 1204 may include a side profile cross section that includes the shape of a trapezoid. For example, a top portion of a pillar interconnect portion may have a width (e.g., diameter) that is less (e.g., smaller) than a bottom portion of the pillar interconnect portion. In some implementations, the plurality of pillar interconnect portions 1204 may have a diagonal side wall. In some implementations, the plurality of pillar interconnect portions 1204 may have a vertical side wall.

Stage 6, as shown in FIG. 12C, illustrates a state after a third photo resist layer 1220 is formed over the second photo resist layer 1210 and patterned to include a plurality of openings 1221 in the third photo resist layer 1220. The plurality of openings 1221 may be located over the plurality of openings 1211. The third photo resist layer 1220 may be similar to the first photo resist layer 1200 and/or the second photo resist layer 1210. A coating process, a masking process and an exposure process that are part of a photolithography process may be used to form and define the pattern of the third photo resist layer 1220.

Stage 7 illustrates a state after a plurality of pillar interconnect portions 1206 are formed through the plurality of openings 1221 of the third photo resist layer 1220. The plurality of pillar interconnect portions 1206 may be formed over the plurality of pillar interconnect portions 1204. A plating process may be used to form the plurality of pillar interconnect portion 1206. The plurality of pillar interconnect portions 1206 may include a side profile cross section that includes the shape of a trapezoid. For example, a top portion of a pillar interconnect portion may have a width (e.g., diameter) that is less (e.g., smaller) than a bottom portion of the pillar interconnect portion. In some implementations, the plurality of pillar interconnect portions 1206 may have a diagonal side wall. In some implementations, the plurality of pillar interconnect portions 1206 may have a vertical side wall. It is noted that the plurality of pillar interconnect portions 1202, the plurality of pillar interconnect portions 1204 and/or the plurality of pillar interconnect portions 1206 may define a plurality of interconnects (e.g., 604) that include side profile cross section comprising a trapezoid shape.

Stage 8, as shown in FIG. 12D, illustrates a state after a plurality of solder interconnects 106 are formed over the plurality of pillar interconnects 604 through the plurality of openings 1221 of the third photo resist layer 1220. In some implementations, a paste process may be used to formed the plurality of solder interconnects 106. However, the plurality of solder interconnects 106 may be formed differently.

Stage 9 illustrates a state after the first photo resist layer 1200, the second photo resist layer 1210 and the third photo resist layer 1220 are removed from the die portion 102. The first photo resist layer 1000, the second photo resist layer 1210 and/or the third photo resist layer 1220 may be removed through a development process. The first photo resist layer 1000, the second photo resist layer 1210 and/or the third photo resist layer 1220 may be removed through a rinsing process.

Exemplary Flow Diagram of a Method for Fabricating an Integrated Device Comprising a Pillar Interconnect In some implementations, fabricating an integrated device includes several processes. FIG. 13 illustrates an exemplary flow diagram of a method 1300 for providing or fabricating an integrated device comprising pillar interconnects. In some implementations, the method 1300 of FIG. 13 may be used to provide or fabricate the integrated device 100 of FIG. 1 that includes the pillar interconnect 404 and/or the pillar interconnect 604 described in the disclosure. However, the method 1300 may be used to provide or fabricate any of the integrated devices described in the disclosure.

It should be noted that the method of FIG. 13 may combine one or more processes in order to simplify and/or clarify the method for providing or fabricating an integrated device. In some implementations, the order of the processes may be changed or modified.

The method provides (at 1305) a die portion (e.g., 102). The die portion 102 may include a die substrate 120, an interconnect portion 122, a passivation layer 105, a plurality of pads 107, a passivation layer 108 and a plurality of under bump metallization interconnects 109. The die portion 102 may include a bare die (e.g., semiconductor bare die). Providing the die portion 102 may include fabricating the die portion. The die portion 102 may be fabricated using FEOL and BEOL fabrication processes. Stage 1 of FIG. 12A, illustrates and describes an example of providing a die portion.

The method forms (at 1310) a first photo resist layer (e.g., 1200) over the die portion (e.g., 102). The method may also pattern (at 1210) the first photo resist layer (e.g., 1200). A coating process, a masking process and an exposure process that are part of a photolithography process may be used to form and define the pattern of the first photo resist layer 1200.

Patterning the first photo resist layer may include forming openings (e.g., 1001) in the first photo resist layer 1200. The plurality of openings 1201 may include a profile shape that includes a trapezoid. For example, the plurality of openings 1201 may have a top width at the top of the first photo resist layer 1200 that is less (e.g., smaller) than a bottom width at the bottom of the first photo resist layer 1200. The plurality of openings 1201 may have side walls than are diagonal. The diagonal side walls of the plurality of openings 1201 may be achieved by shinning a light (e.g., using a laser) at one or more angles (e.g., angles that are non-perpendicular angles to a surface of the first photo resist layer 1200). This approach helps create openings with a top width at the top of the first photo resist layer 1200 that is less (e.g., smaller) than a bottom width at the bottom of the first photo resist layer 1200. The first photo resist layer 1200 may include a positive photo resist layer. However, in some implementations, the first photo resist layer 1200 may include a negative photo resist layer. Stage 2 of FIG. 12A, illustrates and describes an example of forming and patterning a first photo resist layer.

The method forms (at 1315) pillar interconnect portions (e.g., 1202). The pillar interconnect portions 1202 may be formed over the plurality of under bump metallization interconnects 109 (or under bump metallization layer). A plating process may be used to form the pillar interconnect portions 1202. The pillar interconnect portions 1202 may be formed through a plurality of openings 1201 of the first photo resist layer 1200. Stage 3 of FIG. 12A, illustrates and describes an example of forming pillar interconnect portions.

The method forms (at 1320) a second photo resist layer (e.g., 1210) over the first photo resist layer (e.g., 1210). The method may also pattern (at 1220) the second photo resist layer (e.g., 1210). A coating process, a masking process and an exposure process that are part of a photolithography process may be used to form and define the pattern of the second photo resist layer 1210. Stage 4 of FIG. 12B, illustrates and describes an example of forming and patterning a second photo resist layer.

The method forms (at 1325) pillar interconnect portions (e.g., 1204). The pillar interconnect portions 1204 may be formed over the plurality of pillar interconnect portions 1202. A plating process may be used to form the pillar interconnect portions 1204. The pillar interconnect portions 1204 may be formed through a plurality of openings 1311 of the second photo resist layer 1210. Stage 5 of FIG. 12B, illustrates and describes an example of forming pillar interconnect portions.

In some implementations, the method 1300 may iteratively form and pattern additional photo resist layers, and then form additional pillar interconnect portions, in a similar manner as described at 1320 and 1325. Stage 6 of FIG. 12C, illustrates and describes an example of forming and patterning an additional photo resist layer. Stage 7 of FIG. 12C, illustrates and describes an example of forming additional pillar interconnect portions. The plurality of pillar interconnect portions 1202, the plurality of pillar interconnect portions 1204 and/or the plurality of pillar interconnect portions 1206 may define the plurality of pillar interconnects 604.

The method forms (at 1330) a plurality of solder interconnects (e.g., 106). The plurality of solder interconnects 106 may be formed over the plurality of pillar interconnects (e.g., 604) through the plurality of openings 1223 of the third photo resist layer 1220. For example, the plurality of solder interconnects 106 may be formed over the plurality of pillar interconnect portions 1206 through the plurality of openings 1223 of the third photo resist layer 1220. In some implementations, a paste process may be used to formed the plurality of solder interconnects 106. However, the plurality of solder interconnects 106 may be formed differently. Stage 8 of FIG. 12D, illustrates and describes an example of a plurality of solder interconnects formed.

The method removes (at 1335) the photo resist layer(s) (e.g., 1200, 1210, 1220) and portions of the under bump metallization interconnect (e.g., 109). The photo resist layer (s) (e.g., 1200, 1210, 1220) may be removed through a development process. The photo resist layer(s) (e.g., 1200, 1210, 1220) may be removed through a rinsing process.

The method removes (at 1340) portions of the under bump metallization interconnects 109 through an etching process. Stage 9 of FIG. 12D, illustrates and describes an example of a state after a second photo resist layer is removed and portions of an under bump metallization interconnects are removed.

Exemplary Flow Diagram of a Method for Fabricating an Integrated Device Comprising a Pillar Interconnect In some implementations, fabricating an integrated device includes several processes. FIG. 14 illustrates an exemplary flow diagram of a method 1400 for providing or fabricating an integrated device comprising pillar interconnects. In some implementations, the method 1400 of FIG. 14 may be used to provide or fabricate the integrated device 100 of FIG. 1 that includes the pillar interconnect 104, the pillar interconnect 404 and/or the pillar interconnect 604 described in the disclosure. However, the method 1400 may be used to provide or fabricate any of the integrated devices described in the disclosure.

It should be noted that the method of FIG. 14 may combine one or more processes in order to simplify and/or clarify the method for providing or fabricating an integrated device. In some implementations, the order of the processes may be changed or modified. The method 1400 of FIG. 14 may represent a simplified version of the methods of FIGS. 11 and/or 13.

The method provides (at 1405) a die portion (e.g., 102). The die portion 102 may include a die substrate 120, an interconnect portion 122, a passivation layer 105, a plurality of pads 107, a passivation layer 108 and a plurality of under bump metallization interconnects 109. The die portion 102 may include a bare die (e.g., semiconductor bare die). The plurality of under bump metallization interconnects 109 are coupled to the plurality of pads 107. Stage 1 of FIG. 10A, illustrates and describes an example of providing a die portion. Stage 1 of FIG. 12A, illustrates and describes an example of providing a die portion.

The method forms (at 1410) a plurality of pillar interconnects over the plurality of under bump metallization interconnects. Forming the plurality of pillar interconnects includes forming a plurality of pillar interconnect portions. Forming the plurality of pillar interconnects include forming a first pillar interconnect. The first pillar interconnect is formed such that the first pillar interconnect includes a first width that corresponds to a widest part of the first pillar interconnect and a second width that corresponds to a part of the first pillar interconnect that is vertically farthest away from the first under bump metallization interconnect. Forming the first pillar interconnect includes forming a first pillar interconnect portion comprising the first width, and forming a second pillar interconnect portion comprising the second width that is less than the first width. A coating process, a masking process and an exposure process that are part of a photolithography process may be used to form and define the pattern of the photo resist layer(s). A plating process and a development process and/or a rinsing process may be used to form the pillar interconnects and remove the photo resist layer(s). Stages 2-4 of FIGS. 10A-10B illustrate and describes an example of forming a plurality of pillar interconnects. Stages 2-7 of FIGS. 12A-12C illustrate and describes an example of forming a plurality of pillar interconnects.

The method forms (at 1415) a plurality of solder interconnects (e.g., 106) over a plurality of pillar interconnects (e.g., 104, 404, 604). The plurality of solder interconnects 106 may be formed over the plurality of pillar interconnects (e.g., 604) through a plurality of openings of a photo resist layer. In some implementations, a paste process may be used to formed the plurality of solder interconnects 106. However, the plurality of solder interconnects 106 may be formed differently. Stage 6 of FIG. 10C, illustrates and describes an example of a plurality of solder interconnects formed. Stage 8 of FIG. 12D, illustrates and describes an example of a plurality of solder interconnects formed. Once the plurality of interconnects are formed, the photo resist layer(s) and/or portions of the plurality of under bump metallization interconnects may be removed. A development process and/or a rinsing process may be used remove the photo resist layer(s) and/or portions of the plurality of under bump metallization interconnects. Stage 7 of FIG. 10C, illustrates and describes an example of removing a photo resist layer and portions of under bump metallization interconnect. Stage 9 of FIG. 12D, illustrates and describes an example of removing a photo resist layer and portions of under bump metallization interconnect.

Figure 15:
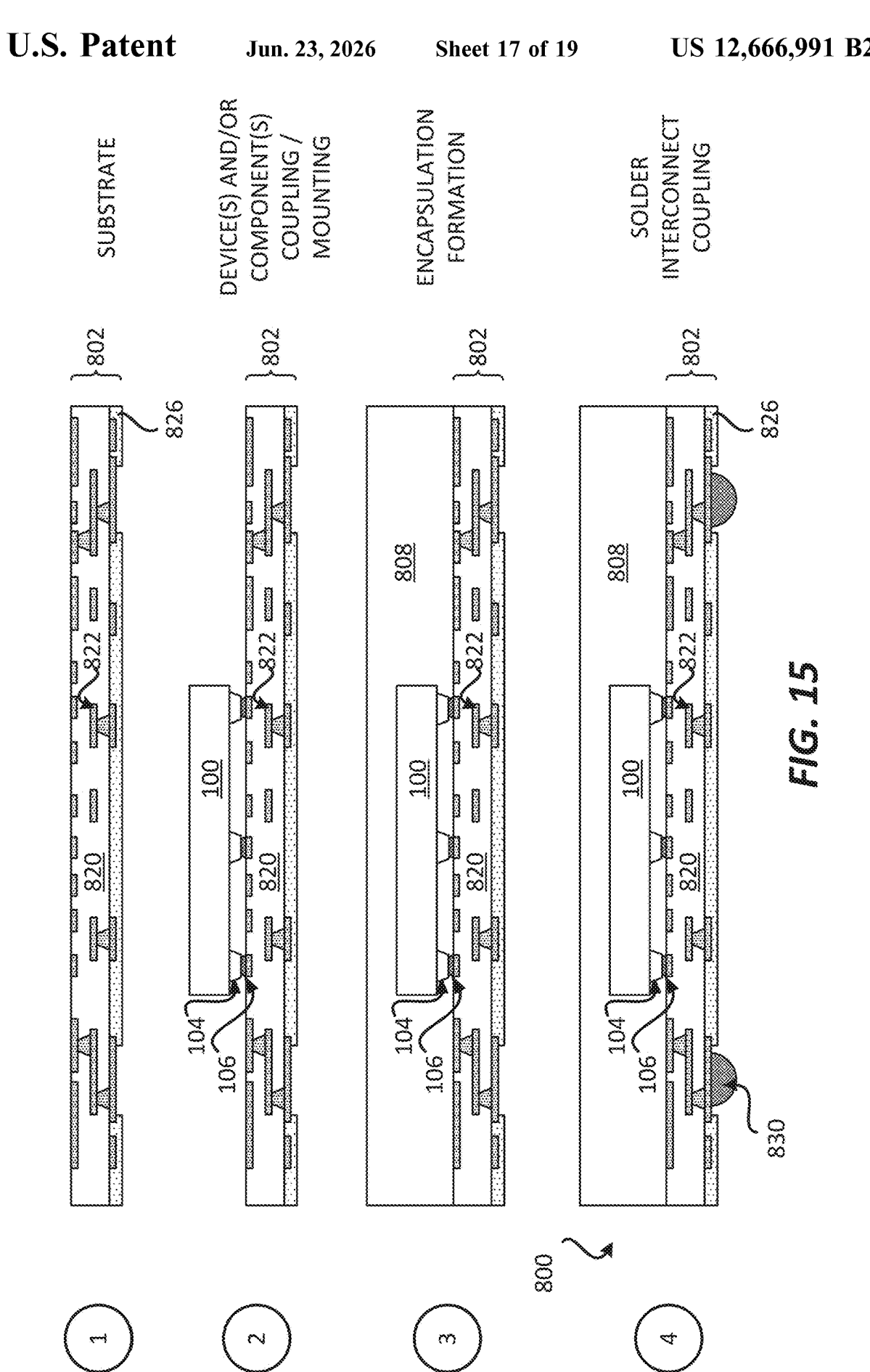
FIG. 15 illustrate an exemplary sequence for fabricating a package comprising an integrated device that includes pillar interconnects.

Exemplary Sequence for Fabricating a Package Comprising an Integrated Device Comprising a Pillar Interconnect In some implementations, fabricating a package includes several processes. FIG. 15 illustrates an exemplary sequence for providing or fabricating a package that includes an integrated device comprising pillar interconnects. In some implementations, the sequence of FIG. 15 may be used to provide or fabricate the package 800 of FIG. 8. However, the process of FIG. 15 may be used to fabricate any of the packages described in the disclosure.

It should be noted that the sequence of FIG. 15 may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 15 illustrates a state after a substrate 802 is provided. The substrate 802 includes at least one dielectric layer 820, a plurality of interconnects 822 and a solder resist layer 826. Different implementations may use different substrates with different numbers of metal layers. A substrate may include a coreless substrate, a cored substrate, or an embedded trace substrate (ETS).

Stage 2 illustrates a state after the integrated device 100 is coupled to the substrate 802 through the plurality of pillar interconnects 104 and the plurality of solder interconnects 106. A solder reflow process may be used to couple the integrated device 100 to the substrate 802. FIG. 9 illustrates an example of how the integrated device 100 may be coupled to the substrate 802. Different implementations may couple different components and/or devices to the substrate 802.

Stage 3 illustrates a state after an encapsulation layer 808 is provided (e.g., formed) over the substrate 802. The encapsulation layer 808 may encapsulate the integrated device 100. The encapsulation layer 808 may include a mold, a resin and/or an epoxy. A compression molding process, a transfer molding process, or a liquid molding process may be used to form the encapsulation layer 808.

The encapsulation layer 808 may be photo etchable. The encapsulation layer 808 may be a means for encapsulation.

Stage 4 illustrates a state after a plurality of solder interconnects 830 is coupled to the substrate 802. A solder reflow process may be used to couple the plurality of solder interconnects 830 to the substrate 802.

Figure 16:
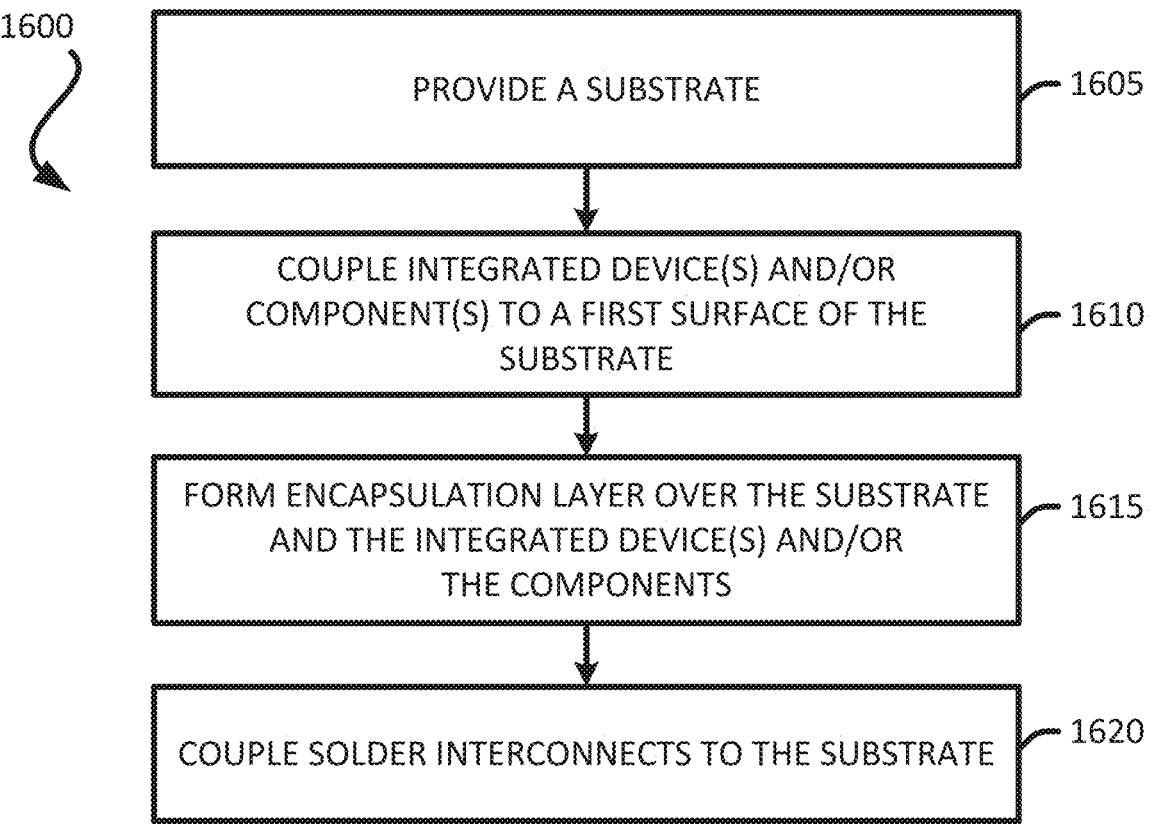
FIG. 16 illustrates an exemplary flow diagram of a method for fabricating a package comprising an integrated device that includes pillar interconnects.

Exemplary Flow Diagram of a Method for Fabricating a Package Comprising an Integrated Device Comprising a Pillar Interconnect In some implementations, fabricating a package includes several processes. FIG. 16 illustrates an exemplary flow diagram of a method 1600 for providing or fabricating a package comprising an integrated device that includes pillar interconnects. In some implementations, the method 1600 of FIG. 16 may be used to provide or fabricate the package 800 of FIG. 8 described in the disclosure. However, the method 1600 may be used to provide or fabricate any of the packages (e.g., 800) described in the disclosure.

It should be noted that the method of FIG. 16 may combine one or more processes in order to simplify and/or clarify the method for providing or fabricating a package. In some implementations, the order of the processes may be changed or modified.

The method provides (at 1605) a substrate (e.g., 802). The substrate 802 may be provided by a supplier or fabricated. Different implementations may use different processes to fabricate the substrate 802. Examples of processes that may be used to fabricate the substrate 802 include a semi-additive process (SAP) and a modified semi-additive process (mSAP). The substrate 802 includes at least one dielectric layer 820, a plurality of interconnects 822, and a solder resist layer 826. The substrate 802 may include an embedded trace substrate (ETS). In some implementations, the at least one dielectric layer 820 may include prepreg layers. Stage 1 of FIG. 15, illustrates and describes an example of providing a substrate.

The method couples (at 1610) an integrated device (e.g., 100, 300, 800) a first surface of the substrate 802. For example, the integrated device 100 is coupled to a first surface (e.g., top surface) of the substrate 802. The integrated device 100 is coupled to the substrate 802 through the plurality of pillar interconnects 104 and the plurality of solder interconnects 106. A solder reflow process may be used to couple the integrated device 100 to the substrate 802. In some implementations, an integrated device may be coupled to the substrate 802 through the plurality of pillar interconnects 104, the plurality of pillar interconnects 304 and/or the plurality of solder interconnects 106. FIGS. 6-8 illustrate examples of how integrated devices may be coupled to the substrate 802. Stage 2 of FIG. 15, illustrates and describes an example of coupling an integrated device to a substrate.

The method forms (at 1615) an encapsulation layer (e.g., 808) over the substrate (e.g., 802). The encapsulation layer 808 may be provided and formed over and/or around the substrate 802 and the integrated device 100. The encapsulation layer 808 may include a mold, a resin and/or an epoxy. A compression molding process, a transfer molding process, or a liquid molding process may be used to form the encapsulation layer 808. The encapsulation layer 808 may be photo etchable. The encapsulation layer 808 may be a means for encapsulation. Stage 3 of FIG. 15, illustrates and describes an example of forming an encapsulation layer.

The method couples (at 1620) a plurality of solder interconnects (e.g., 830) to the substrate 802. A solder reflow process may be used to couple the plurality of solder interconnects 830 to the substrate 802. Stage 4 of FIG. 15, illustrates and describes an example of coupling solder interconnects to a substrate.

The packages (e.g., 800) described in the disclosure may be fabricated one at a time or may be fabricated together as part of one or more wafers and then singulated into individual packages.

Exemplary Electronic Devices

Figure 17:
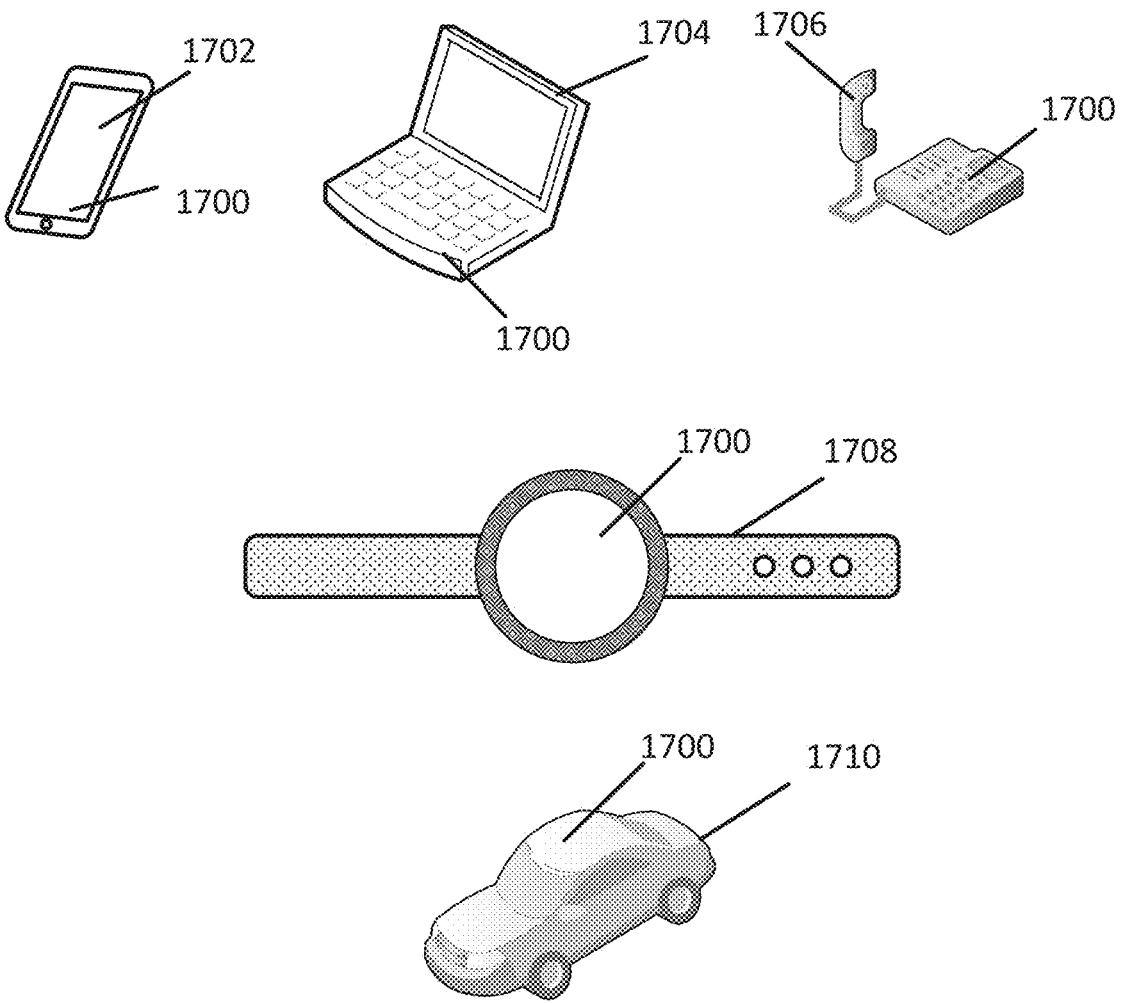
FIG. 17 illustrates various electronic devices that may integrate a die, an electronic circuit, an integrated device, an integrated passive device (IPD), a passive component, a package, and/or a device package described herein.

FIG. 17 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1702, a laptop computer device 1704, a fixed location terminal device 1706, a wearable device 1708, or automotive vehicle 1710 may include a device 1700 as described herein. The device 1700 may be, for example, any of the devices and/or integrated circuit (IC) packages described herein. The devices 1702, 1704, 1706 and 1708 and the vehicle 1710 illustrated in FIG. 17 are merely exemplary. Other electronic devices may also feature the device 1700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-9, 10A-10C, 11, 12A-12D and/or 13-17 may be rearranged and/or combined into a single component, process, feature or function or embodied in several components, processes, or functions. Additional elements, components, processes, and/or functions may also be added without departing from the disclosure. It should also be noted FIGS. 1-9, 10A-10C, 11, 12A-12D and/or 13-17 and its corresponding description in the present disclosure is not limited to dies and/or ICs. In some implementations. FIGS. 1-9, 10A-10C, 11, 12A-12D and/or 13-17 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/ or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/ or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: An integrated device comprising a die portion and a plurality of pillar interconnects. The die portion comprises a plurality of pads and a plurality of under bump metallization interconnects coupled to the plurality of pads, wherein the plurality of under bump metallization interconnects comprises a first under bump metallization interconnect. The plurality of pillar interconnects is coupled to the plurality of under bump metallization interconnects. The plurality of pillar interconnects includes a first pillar interconnect comprising a first width that corresponds to a widest part of the first pillar interconnect; and a second width that corresponds to a part of the first pillar interconnect that is vertically farthest away from the first under bump metallization interconnect, where the second width is less than the first width.

Aspect 2: The integrated device of aspect 1, wherein the first pillar interconnect includes a diagonal surface.

Aspect 3: The integrated device of aspects 1 through 2, wherein the first pillar interconnect includes a surface that includes a step surface.

Aspect 4: The integrated device of aspects 1 through 3, wherein the first pillar interconnect includes a profile cross section that includes a trapezoid shape.

Aspect 5: The integrated device of aspect 4, wherein the trapezoid shape includes a top portion and a bottom portion, wherein the top portion of the trapezoid shape is farther away from the first under bump metallization interconnect than the bottom portion of the trapezoid shape is from the first under bump metallization interconnect, wherein the bottom portion of the trapezoid shape has the first width, and wherein the top portion of the trapezoid shape has the second width.

Aspect 6: The integrated device of aspects 1 through 5, wherein the first pillar interconnect includes a profile cross section that includes a first trapezoid shape and a second trapezoid shape.

Aspect 7: The integrated device of aspect 6, wherein the second trapezoid shape is an inverted trapezoid shape relative to the first trapezoid shape.

Aspect 8: The integrated device of aspects 1 through 7, wherein the first pillar interconnect includes a first diagonal surface with a first angle and a second diagonal surface with a second angle.

Aspect 9: The integrated device of aspects 1 through 8, wherein the die portion comprises: a die substrate; a plurality of transistors formed in and/or over the die substrate; and an interconnect portion located over the die substrate.

Aspect 10: A package comprising a substrate and an integrated device. The integrated device includes a plurality of under bump metallization interconnects comprising a first under bump metallization interconnect, and a plurality of pillar interconnects comprising a first pillar interconnect. The first pillar interconnect is coupled to the first under bump metallization interconnect. The first pillar interconnect comprises a first width that corresponds to a widest part of the first pillar interconnect, and a second width that corresponds to a part of the first pillar interconnect that is vertically farthest away from the first under bump metallization interconnect, where the second width is less than the first width. The integrated device is coupled to the substrate through the plurality of pillar interconnects and the plurality of solder interconnects.

Aspect 11: The package of aspect 10, wherein the first pillar interconnect includes a diagonal surface.

Aspect 12: The package of aspects 10 through 11, wherein the first pillar interconnect includes a surface that includes a step surface.

Aspect 13: The package of aspects 10 through 12, wherein the first pillar interconnect includes a profile cross section that includes a trapezoid shape.

Aspect 14: The package of aspect 13, wherein the trapezoid shape includes a top portion and a bottom portion, wherein the top portion of the trapezoid shape is farther away from the first under bump metallization interconnect than the bottom portion of the trapezoid shape is from the first under bump metallization interconnect, wherein the bottom portion of the trapezoid shape has the first width, and wherein the top portion of the trapezoid shape has the second width.

Aspect 15: The package of aspects 10 through 14, wherein the first pillar interconnect includes a profile cross section that includes a first trapezoid shape and a second trapezoid shape.

Aspect 16: The package of aspect 15, wherein the second trapezoid shape is an inverted trapezoid shape relative to the first trapezoid shape.

Aspect 17: The package of aspects 10 through 16, wherein the first pillar interconnect includes a first diagonal surface with a first angle and a second diagonal surface with a second angle.

Aspect 18: The package of aspects 10 through 17, wherein the package is part of a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 19: A method for fabricating an integrated device. The method provides a die portion comprising a plurality of pads; and a plurality of under bump metallization interconnects coupled to the plurality of pads. The method forms a plurality of pillar interconnects over the plurality of under bump metallization interconnects, wherein forming the plurality of pillar interconnects comprises forming a first pillar interconnect such that the first pillar interconnect comprises: a first width that corresponds to a widest part of the first pillar interconnect; and a second width that corresponds to a part of the first pillar interconnect that is vertically farthest away from the first under bump metallization interconnect, where the second width is less than the first width.

Aspect 20: The method of aspect 19, wherein forming the first pillar interconnect comprises forming the first pillar interconnect such that the first pillar interconnect includes a diagonal surface.

Aspect 21: The method of aspects 19 through 20, wherein forming the first pillar interconnect comprises forming the first pillar interconnect such that a profile cross section of the first pillar interconnect includes a trapezoid shape.

Aspect 22: The method of aspect 21, wherein the trapezoid shape includes a top portion and a bottom portion, wherein the top portion of the trapezoid shape is farther away from the first under bump metallization interconnect than the bottom portion of the trapezoid shape is from the first under bump metallization interconnect, wherein the bottom portion of the trapezoid shape has the first width, and wherein the top portion of the trapezoid shape has the second width.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated device comprising:
   a die portion comprising:
      a plurality of pads comprising a first pad;
      a first passivation layer coupled to and touching the plurality of pads;
      a second passivation layer coupled to and touching the first passivation layer, wherein the second passivation layer is different from the first passivation layer; and
      a plurality of under bump metallization interconnects coupled to the plurality of pads, wherein the plurality of under bump metallization interconnects comprises a first under bump metallization interconnect that is coupled to and touching the first pad; and
   a plurality of pillar interconnects coupled to the plurality of under bump metallization interconnects, wherein the plurality of pillar interconnects includes a first pillar interconnect that is coupled to and touching the first under bump metallization interconnect, wherein the first pillar interconnect comprises:
      a first width that corresponds to a widest part of the first pillar interconnect; and
      a second width that corresponds to a part of the first pillar interconnect that is vertically farthest away from the first under bump metallization interconnect, wherein the second width is less than the first width, wherein the first pillar interconnect includes a profile cross section that includes (i) a first trapezoid shape and (ii) a second trapezoid shape that is coupled to and touching the first trapezoid shape, wherein the second trapezoid shape is an inverted trapezoid shape relative to the first trapezoid shape, wherein the first trapezoid shape touches the first under bump metallization interconnect from the plurality of under bump metallization interconnects, and wherein the second width is a width of a part of the second trapezoid shape that is vertically farthest away from the first under bump metallization interconnect.

2. The integrated device of claim 1, wherein the first pillar interconnect includes a diagonal surface, wherein the first passivation layer includes a hard passivation layer, and wherein the second passivation layer includes a polymer passivation layer.

3. The integrated device of claim 1, wherein the first pillar interconnect includes a surface that includes a step surface.

4. The integrated device of claim 1, wherein the first pillar interconnect includes the profile cross section that further includes a third trapezoid shape that is coupled to and touching the second trapezoid shape such that the second trapezoid shape is located between the first trapezoid shape the third trapezoid shape, and wherein the third trapezoid shape is an inverted trapezoid shape relative to the first trapezoid shape.

5. The integrated device of claim 4, wherein the first pillar interconnect includes the profile cross section that further includes a fourth trapezoid shape that is coupled to and touching the third trapezoid shape.

6. The integrated device of claim 1, wherein a portion of the second trapezoid shape touches the first under bump metallization interconnect.

7. The integrated device of claim 6, wherein the second trapezoid shape includes a first portion that has the first width and a second portion that has the second width.

8. The integrated device of claim 1, wherein the first pillar interconnect includes a first diagonal surface with a first angle and a second diagonal surface with a second angle.

9. The integrated device of claim 1, wherein the die portion comprises:
a die substrate;
a plurality of transistors formed in and/or over the die substrate; and
an interconnect portion located over the die substrate.

10. A package comprising:
a substrate; and
an integrated device comprising:
a plurality of pad interconnects comprising a first pad;
a plurality of under bump metallization interconnects comprising a first under bump metallization interconnect that is coupled to and touching the first pad; and
a plurality of pillar interconnects comprising a first pillar interconnect,
wherein the first pillar interconnect is coupled to and touching the first under bump metallization interconnect, and
wherein the first pillar interconnect comprises:
a first width that corresponds to a widest part of the first pillar interconnect; and
a second width that corresponds to a part of the first pillar interconnect that is vertically farthest away from the first under bump metallization interconnect, wherein the second width is less than the first width, and wherein the integrated device is coupled to the substrate through the plurality of pillar interconnects and the plurality of solder interconnects,
wherein the first pillar interconnect includes a profile cross section that includes (i) a first trapezoid shape and (ii) a second trapezoid shape that is coupled to and touching the first trapezoid shape,
wherein the second trapezoid shape is an inverted trapezoid shape relative to the first trapezoid shape,
wherein the first trapezoid shape touches the first under bump metallization interconnect from the plurality of under bump metallization interconnects, and
wherein the second width is a width of a part of the second trapezoid shape that is vertically farthest away from the first under bump metallization interconnect.

11. The package of claim 10, wherein the integrated device further comprises:
a first passivation layer coupled to and touching the plurality of pads; and
a second passivation layer coupled to and touching the first passivation layer,
wherein the first passivation layer includes a hard passivation layer, and
wherein the second passivation layer includes a polymer passivation layer, and
wherein the first pillar interconnect includes a diagonal surface.

12. The package of claim 10, wherein the first pillar interconnect includes a surface that includes a step surface.

13. The package of claim 10, wherein the first pillar interconnect includes the profile cross section that further includes a third trapezoid shape that is coupled to and touching the second trapezoid shape such that the second trapezoid shape is located between the first trapezoid shape the third trapezoid shape, and wherein the third trapezoid shape is an inverted trapezoid shape relative to the first trapezoid shape.

14. The package of claim 13, wherein the first pillar interconnect includes the profile cross section that further includes a fourth trapezoid shape that is coupled to and touching the third trapezoid shape.

15. The package of claim 10, wherein a portion of the second trapezoid shape touches the first under bump metallization interconnect.

16. The package of claim 15, wherein the second trapezoid shape includes a first portion that has the first width and a second portion that has the second width.

17. The package of claim 10, wherein the first pillar interconnect includes a first diagonal surface with a first angle and a second diagonal surface with a second angle.

18. The package of claim 10, wherein the package is part of a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IOT) device, and a device in an automotive vehicle.

19. A method for fabricating an integrated device, comprising:
providing a die portion comprising:
a plurality of pads comprising a first pad;
a first passivation layer coupled to and touching the plurality of pads;

a second passivation layer coupled to and touching the first passivation layer, wherein the second passivation layer is different from the first passivation layer; and a plurality of under bump metallization interconnects coupled to the plurality of pads, wherein the plurality of under bump metallization interconnects comprise a first under bump metallization interconnect that is coupled to and touching the first pad; and forming a plurality of pillar interconnects over the plurality of under bump metallization interconnects, wherein forming the plurality of pillar interconnects comprises forming a first pillar interconnect that is coupled to and touching the first under bump metallization interconnect, wherein the first pillar interconnect comprises:

a first width that corresponds to a widest part of the first pillar interconnect; and a second width that corresponds to a part of the first pillar interconnect that is vertically farthest away from the first under bump metallization interconnect, wherein the second width is less than the first width, wherein the first pillar interconnect includes a profile cross section that includes (i) a first trapezoid shape and (ii) a second trapezoid shape that is coupled to and touching the first trapezoid shape, wherein the second trapezoid shape is an inverted trapezoid shape relative to the first trapezoid shape, wherein the first trapezoid shape touches the first under bump metallization interconnect from the plurality of under bump metallization interconnects, and wherein the second width is a width of a part of the second trapezoid shape that is vertically farthest away from the first under bump metallization interconnect.

20. The method of claim 19, wherein forming the first pillar interconnect comprises forming the first pillar interconnect such that the first pillar interconnect includes a diagonal surface, wherein the first passivation layer includes a hard passivation layer, and wherein the second passivation layer includes a polymer passivation layer.

21. The method of claim 19, wherein forming the first pillar interconnect comprises forming the first pillar interconnect such that the profile cross section of the first pillar interconnect further includes a third trapezoid shape that is coupled to and touching the second trapezoid shape such that the second trapezoid shape is located between the first trapezoid shape the third trapezoid shape, and wherein the third trapezoid shape is an inverted trapezoid shape relative to the first trapezoid shape.

22. The method of claim 21, wherein forming the plurality of pillar interconnects comprises further forming a second pillar interconnect such that the second pillar interconnect comprises a profile cross section that includes (i) another first trapezoid shape and (ii) another second trapezoid shape that is coupled to and touching the another first trapezoid shape, wherein the another second trapezoid shape is an inverted trapezoid shape relative to the another first trapezoid shape.

* * * * *